(12) United States Patent
Lee et al.

(10) Patent No.: US 11,004,870 B2
(45) Date of Patent: May 11, 2021

(54) TRANSISTOR STRUCTURE, DISPLAY DEVICE INCLUDING TRANSISTOR STRUCTURE, AND METHOD OF MANUFACTURING TRANSISTOR STRUCTURE

(71) Applicant: Samsung Display Co. Ltd., Yongin-si (KR)

(72) Inventors: Hyun Sup Lee, Hwaseong-si (KR); Jung Hun Noh, Yongin-si (KR); Keun Kyu Song, Seongnam-si (KR); Sang Hee Jang, Bucheon-si (KR); Byung Seok Choi, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/473,356

(22) Filed: Mar. 29, 2017

(65) Prior Publication Data

US 2017/0317110 A1   Nov. 2, 2017

(30) Foreign Application Priority Data

Apr. 29, 2016  (KR) ........................ 10-2016-0053025

(51) Int. Cl.
*H01L 27/12* (2006.01)
*G02F 1/1362* (2006.01)
(Continued)

(52) U.S. Cl.
CPC ........ *H01L 27/1222* (2013.01); *G02F 1/1368* (2013.01); *G02F 1/136209* (2013.01);
(Continued)

(58) Field of Classification Search
CPC ............ H01L 29/78642; H01L 27/124; H01L 27/1248; H01L 27/1244
See application file for complete search history.

(56) References Cited

U.S. PATENT DOCUMENTS 4,633,284 A * 12/1986 Hansell ............ H01L 29/78684
257/58
4,757,361 A * 7/1988 Brodsky ............ H01L 23/4825
257/57
(Continued)

FOREIGN PATENT DOCUMENTS

| KR | 10-2002-0037417 A | 5/2002 |
|---|---|---|
| KR | 10-2005-0001936 A | 1/2005 |
| KR | 10-2013-0074954 A | 7/2013 |

*Primary Examiner* — Cuong Q Nguyen
*Assistant Examiner* — Peter M Albrecht
(74) *Attorney, Agent, or Firm* — Innovation Counsel LLP

(57) ABSTRACT

A transistor structure may include a first electrode, a second electrode, a third electrode, a substrate, and a semiconductor member. The semiconductor member overlaps the third electrode and includes a first semiconductor portion, a second semiconductor portion, and a third semiconductor portion. The first semiconductor portion directly contacts the first electrode, is directly connected to the third semiconductor portion, and is connected through the third semiconductor portion to the second semiconductor portion. The second semiconductor portion directly contacts the second electrode and is directly connected to the third semiconductor portion. A minimum distance between the first semiconductor portion and the substrate is unequal to a minimum distance between the second semiconductor portion and the substrate.

12 Claims, 19 Drawing Sheets

(51) Int. Cl.
*G02F 1/1368* (2006.01)
*H01L 29/66* (2006.01)
*H01L 29/786* (2006.01)
*H01L 27/32* (2006.01)

(52) U.S. Cl.
CPC ........ *H01L 27/124* (2013.01); *H01L 27/1218* (2013.01); *H01L 29/66765* (2013.01); *H01L 29/66969* (2013.01); *H01L 29/78603* (2013.01); *H01L 29/78642* (2013.01); *H01L 29/78696* (2013.01); *G02F 1/136227* (2013.01); *G02F 2201/40* (2013.01); *H01L 27/3248* (2013.01); *H01L 27/3262* (2013.01)

(56) References Cited

U.S. PATENT DOCUMENTS

| | | | |
|---|---|---|---|
| 5,563,077 | A | 10/1996 | Ha |
| 6,800,874 | B2 | 10/2004 | Hsieh |
| 7,265,393 | B2 | 9/2007 | Schuele et al. |
| 7,588,971 | B2 | 9/2009 | Wang et al. |
| 9,117,914 | B1* | 8/2015 | Ellinger ............ H01L 29/78642 |
| 2007/0018159 | A1* | 1/2007 | Baek .................... H01L 27/124 |
| | | | 257/59 |
| 2007/0228471 | A1 | 10/2007 | Schuele et al. |
| 2010/0245700 | A1* | 9/2010 | Zhao ................... G02F 1/13624 |
| | | | 349/48 |
| 2010/0245735 | A1* | 9/2010 | Xie .................... G02F 1/136286 |
| | | | 349/110 |
| 2017/0229483 | A1* | 8/2017 | Chang ................. H01L 27/1214 |
| 2017/0256649 | A1* | 9/2017 | Takamaru ............. G02F 1/1368 |
| 2017/0307919 | A1* | 10/2017 | Wang ................ G02F 1/134309 |
| 2018/0204842 | A1* | 7/2018 | Karpov ............... H01L 45/1625 |

* cited by examiner

TRANSISTOR STRUCTURE, DISPLAY DEVICE INCLUDING TRANSISTOR STRUCTURE, AND METHOD OF MANUFACTURING TRANSISTOR STRUCTURE

This application claims priority to and benefit from Korean Patent Application No. 10-2016-0053025 filed on Apr. 29, 2016 in the Korean Intellectual Property Office; the disclosure of the Korean Patent application is incorporated herein by reference in its entirety.

BACKGROUND

1. Field

The technical field relates to a transistor structure, a liquid crystal display device including the transistor structure, and a method of manufacturing the transistor structure.

2. Description of the Related Art

A display device may display images according to input signals. Various types of display devices may include liquid crystal display (LCD) devices, organic light emitting display (OLED) devices, and others.

A display device, such as a liquid crystal display device, may include field generating electrodes, such as a pixel electrode and a common electrode, and a liquid crystal layer. A voltage may be applied to the field generating electrodes to generate an electric field in the liquid crystal layer for controlling transmission of incident light, thereby displaying an image.

A display device may include a transistor and a light-blocking member. The transistor may control application of the voltage and may be disposed in a light blocking region covered by the light-blocking member. The size of the light blocking region may affect quality of images displayed by the display device.

SUMMARY

In an embodiment, an array substrate may be/include a transistor structure.

An embodiment may be related to an array substrate including a pixel having a high aperture ratio.

An embodiment may be related to an array substrate including a thin film transistor having stable electrical characteristics.

An embodiment may be related to an array substrate suitable for a high-resolution display device.

An embodiment may be related to a display device, e.g., a liquid crystal display device, having a high aperture ratio.

An embodiment may be related to a display device, e.g., a liquid crystal display device, including a thin film transistor having stable electrical characteristics.

An embodiment may be related to a display device, e.g., a liquid crystal display device, including an array substrate suitable for a high-resolution display device.

An embodiment may be related to a method of manufacturing an array substrate including a pixel having a high aperture ratio.

An embodiment may be related to a method of manufacturing an array substrate including a thin film transistor having stable electrical characteristics.

An embodiment may be related to a method of manufacturing an array substrate suitable for a high-resolution display device.

According to an embodiment, an array substrate (which may be/include a transistor structure) may include the following elements: a first substrate (or base substrate); a structural member disposed on the first substrate, including an upper surface positioned over the upper surface of the first substrate, and including a lateral surface extending from the upper surface of the structural member toward the upper surface of the first substrate; a gate electrode disposed on the lateral surface of the structural member; a source electrode and a drain electrode insulated from the gate electrode and spaced apart from each other; and a semiconductor member contacting each of the source electrode and the drain electrode, wherein either the source electrode or the drain electrode is disposed on the upper surface of the structural member.

The gate electrode may be disposed on the lateral surface of the structural member.

The lateral surface of the structural member may include an inclined surface, and the gate electrode may be disposed along the inclined surface.

The semiconductor member may be disposed on the gate electrode, and may include an inclined surface having the same slope as the inclined surface of the lateral surface of the structural member.

The array substrate may include a channel electrically connecting the source electrode and the drain electrode, wherein the channel extends along the inclined surface of the semiconductor member. The channel may be part of the semiconductor member.

One end of the gate electrode may overlap the upper surface of the structural member in a vertical direction, and the other end of the gate electrode may not overlap the upper surface of the structural member in the vertical direction.

One end of the semiconductor member may overlap the upper surface of the structural member in a vertical direction, and the other end of the semiconductor member may not overlap the upper surface of the structural member in the vertical direction.

The semiconductor member may overlap the lateral surface of the structural member in a horizontal direction.

The angle between the lateral surface of the structural member and the upper surface of the first substrate may be a right angle.

The angle between the lateral surface of the structural member and the upper surface of the first substrate may be an acute angle.

The array substrate may further include the following elements: a gate line connected with the gate electrode and extending in a first direction; and a data line connected with the source electrode and extending in a second direction, wherein a part of the data line is disposed on the structural member.

The source electrode and the drain electrode may be disposed on the gate electrode.

The gate electrode may be disposed on the source electrode and the drain electrode.

The source electrode and the drain electrode may be disposed on different levels.

The array substrate may further include: a pixel electrode electrically connected with the drain electrode.

One end of the semiconductor member may be in contact with the lower surface of the source electrode, and the other end of the semiconductor member may be in contact with the upper surface of the drain electrode.

According an embodiment, an array substrate (which may be/include a transistor structure) may include the following elements: a first substrate; a first pixel and a second pixel disposed on the first substrate and positioned adjacent to each other; and a structural member disposed over the first pixel and the second pixel, including an upper surface positioned over the upper surface of the first substrate, and including a lateral surface extending from the upper surface toward the upper surface of the first substrate. The first pixel includes the following elements: a first gate electrode disposed on the structural member; a first source electrode and a first drain electrode insulated from the first gate electrode and spaced apart from each other; and a first semiconductor member contacting each of the first source electrode and the first drain electrode. The second pixel includes the following elements: a second gate electrode disposed on the structural member; a second source electrode and a second drain electrode insulated from the second gate electrode and spaced apart from each other; and a second semiconductor member contacting each of the second source electrode and the second drain electrode. Either one of the first source electrode and the first drain electrode and either one of the second source electrode and the second drain electrode are disposed on the upper surface of the structural member.

The array substrate may further include the following elements: a first data line connected with the first source electrode; and a second data line connected with the second source electrode, wherein at least one selected from a part of the first data line and a part of the second data line is disposed on the upper surface of the structural member.

A part of the first data line may overlap the upper surface of the structural member in a vertical direction, and a part of the second data line may not overlap the upper surface of the structural member in the vertical direction.

The part of the first data line and the part of the second data line may be disposed on the upper surface of the structural member to be adjacent to each other.

The first gate electrode may be disposed on the first source electrode and the first drain electrode, and the second gate electrode may be disposed on the second source electrode and the second drain electrode.

The first source electrode and the first drain electrode may be disposed on the first gate electrode, and the second source electrode and the second drain electrode may be disposed on the second gate electrode.

According an embodiment, a display device, e.g., a liquid crystal display device, may include the following elements: a first substrate; a structural member which is disposed on the first substrate, includes an upper surface positioned over the upper surface of the first substrate, and includes a lateral surface extending from the upper surface toward the upper surface of the first substrate; a gate electrode disposed on the structural member; a source electrode and a drain electrode insulated from the gate electrode and spaced apart from each other; and a semiconductor member contacting each of the source electrode and the drain electrode; and a second substrate facing the first substrate, wherein either the source electrode or the drain electrode is disposed on the upper surface of the structural member.

A color filter overlapping the pixel electrode and a black matrix may be disposed on the second substrate. The black matrix may overlap (and cover) the source electrode, the drain electrode, and the semiconductor member.

The liquid crystal display device may further include a common electrode disposed entirely on the color filter and the black matrix.

A color filter may be disposed on the pixel electrode of the first substrate, and a black matrix may be disposed on the source electrode, the drain electrode, and the semiconductor member.

According an embodiment, a method of manufacturing an array substrate (which may be/include a transistor structure) may include the following steps: forming on a first substrate a structural member, the structural member including an upper surface positioned over the upper surface of the first substrate and including a lateral surface extending from the outside of the upper surface toward the upper surface of the first substrate; forming a gate electrode on the structural member; forming a semiconductor member on the gate electrode; and forming a source electrode and a drain electrode spaced apart from each other to be insulated from the gate electrode, wherein either the source electrode or the drain electrode is formed on the upper surface of the structural member.

According an embodiment, provided a method of manufacturing an array substrate (which may be/include a transistor structure) may include the following steps: forming on a first substrate a structural member, the structural member including an upper surface positioned over the upper surface of the first substrate and including a lateral surface extending from the upper surface toward the upper surface of the first substrate; forming a semiconductor member on the structural member; forming a source electrode and a drain electrode spaced apart from each other on the semiconductor member, wherein either the source electrode or the drain electrode is formed on the upper surface of the structural member; and forming a gate electrode on the semiconductor member.

An embodiment may be related to a transistor structure. The transistor structure may be included in a display device. The transistor structure may include a first electrode, a second electrode, a third electrode, a substrate, and a first semiconductor member. The first electrode may function as a source electrode or a drain electrode of a transistor. The second electrode may function as a drain electrode or a source electrode of the transistor. The third electrode may function as a gate electrode of the transistor. The substrate may overlap each of the first electrode, the second electrode, and the third electrode. The first semiconductor member may overlap the third electrode and may include a first semiconductor portion, a second semiconductor portion, and a third semiconductor portion. The first semiconductor portion may directly contact the first electrode, may not directly contact the second electrode, may be directly connected to the third semiconductor portion, and may be connected through the third semiconductor portion to the second semiconductor portion. The second semiconductor portion may directly contact the second electrode, may not directly contact the first electrode, and may be directly connected to the third semiconductor portion. A minimum distance between the first semiconductor portion and the substrate may be unequal to a minimum distance between the second semiconductor portion and the substrate.

Each of the first semiconductor portion, the second semiconductor portion, and the third semiconductor portion may be (substantially) flat. A maximum thickness of the first semiconductor portion in a direction perpendicular to contact side of the first semiconductor portion, a maximum thickness of the second semiconductor portion in a direction perpendicular to a contact side of the second semiconductor portion, and a maximum thickness of the third semiconductor portion in a direction perpendicular to contact side of the third semiconductor portion may be equal to one another.

The third semiconductor portion may overlap the third electrode, may be spaced and/or separated from the third electrode, and may not be aligned with either of the first semiconductor portion and the second semiconductor portion.

The third semiconductor portion may extend at a first angle with respect to the first semiconductor portion in a cross-sectional view of the transistor structure. The first angle may be greater than 0 degree and less than 180 degrees.

The first angle may be less than or equal to 90 degrees.

The first angle may be greater than 90 degree and less than 180 degrees.

The third semiconductor portion may directly contact the first electrode.

The third semiconductor portion may extend at a second angle with respect to the second semiconductor portion in the cross-sectional view of the transistor structure. The second angle may be greater than 0 degree and less than 180 degrees.

The second angle may be less than or equal to 90 degrees.

The second angle may be greater than 90 degree and less than 180 degrees.

The first angle may be equal to the second angle.

The third semiconductor portion may directly contact the second electrode.

The third semiconductor portion may extend at a third angle with respect to a side of the substrate in the cross-sectional view of the transistor structure. The third angle may be greater than 0 degree and less than 180 degrees.

The third angle may be complementary to at least one of the first angle and the second angle.

The third semiconductor portion may extend at an inclination angle with respect to a side (e.g., top/bottom side) of the substrate in a cross-sectional view of the transistor structure. The inclination angle may be greater than 0 degree and less than 180 degrees. The third semiconductor portion may extend at an included angle with respect to the first semiconductor portion in the cross-sectional view of the transistor structure. The inclination angle may be a complementary angle to the included angle.

The first semiconductor portion may be positioned between a portion of the first electrode and the substrate in a direction perpendicular to a side (e.g., top/bottom side) of the substrate. A portion of the second electrode may be positioned between the second semiconductor portion and the substrate in the direction perpendicular to the side of the substrate.

The third electrode (e.g., a gate electrode) may include a first conductive portion, a second conductive portion, and a third conductive portion. The first conductive portion may overlap the first semiconductor portion (in a direction perpendicular to a side of the substrate), may be directly connected to the third conductive portion, and may be connected through the third conductive portion to the second conductive portion. The second conductive portion may overlap the second semiconductor portion (in the direction perpendicular to a side of the substrate) and may be directly connected to the third conductive portion. A minimum distance between the first conductive portion and the substrate may be unequal to a minimum distance between the second conductive portion and the substrate.

The transistor structure may include a structural member. The structural member may be positioned between the first semiconductor portion and the substrate in a direction perpendicular to a side (e.g., top/bottom side) of the substrate. The minimum distance between the first semiconductor portion and the substrate may be greater than the minimum distance between the second semiconductor portion and the substrate by a first amount. The first amount may be greater than 0 and may be less than or equal to a thickness of the structural member.

The first amount may be equal to the thickness of the structural member.

The thickness of the structural member may be greater than a thickness of the second electrode (in a direction of the thickness of the structural member). The first amount may be equal to the thickness of the structural member minus the thickness of the second electrode.

A minimum distance between the first electrode (e.g., a source/drain electrode) and the substrate may be greater than a minimum distance between the second electrode (e.g., a drain/source electrode) and the substrate by the thickness of the structural member.

The third electrode (e.g., a gate electrode) may include a first conductive portion, a second conductive portion, and a third conductive portion. The first conductive portion may overlap the first semiconductor portion (in a direction perpendicular to a side of the substrate), may be directly connected to the third conductive portion, and may be connected through the third conductive portion to the second conductive portion. The second conductive portion may overlap the second semiconductor portion (in the direction perpendicular to a side of the substrate) and may be directly connected to the third conductive portion. A minimum distance between the first conductive portion and the substrate may be greater than a minimum distance between the second conductive portion and the substrate by a second amount. The second amount may be greater than 0 and may be less than or equal to the thickness of the structural member.

The second amount may be equal to the thickness of the structural member.

The transistor structure may include a fourth electrode (e.g., a second source/drain electrode), a fifth electrode (e.g., a second drain/source electrode), a sixth electrode (e.g., a second gate electrode), a second semiconductor member, and an insulating film (or gate insulating film). The second semiconductor member may overlap the sixth electrode and may include a fourth semiconductor portion, a fifth semiconductor portion, and a sixth semiconductor portion. The insulating film may directly contact each of the third electrode, the sixth electrode, the first semiconductor member, the second semiconductor member, and the structural member. The fourth semiconductor portion may directly contact the fourth electrode, may not directly contact the fifth electrode, may be directly connected to the sixth semiconductor portion, and may be connected through the sixth semiconductor portion to the fifth semiconductor portion. The fifth semiconductor portion may directly contact the fifth electrode, may not directly contact the fourth electrode, and may be directly connected to the sixth semiconductor portion. A minimum distance between the fourth semiconductor portion and the substrate may be unequal to a minimum distance between the fifth semiconductor portion and the substrate. The structural member may include a first structural part, a second structural part, and a third structural part. The first structural part may directly contact exactly one of the third electrode and the first semiconductor member, may be directly connected to the third structural part, and may be connected through the third structural part to the second structural part. The second structural part may directly contact exactly one of the sixth electrode and the second semiconductor member and may be directly connected to the third structural part. The third structural part may directly contact the insulating film.

An embodiment may be related to a display device. The display device may be/include a liquid crystal display device and/or an organic light emitting display device. The display device may include a first electrode, a second electrode, a third electrode, a substrate, a semiconductor member, and a structural member. The substrate may overlap each of the first electrode, the second electrode, and the third electrode. The semiconductor member may overlap the third electrode and may include a first semiconductor portion, a second semiconductor portion, and a third semiconductor portion. The structural member may be positioned between the first semiconductor portion and the substrate in a direction perpendicular to a side of the substrate. The first semiconductor portion may directly contact the first electrode, may be directly connected to the third semiconductor portion, and may be connected through the third semiconductor portion to the second semiconductor portion. The second semiconductor portion may directly contact the second electrode and may be directly connected to the third semiconductor portion. A minimum distance between the first semiconductor portion and the substrate may be greater than a minimum distance between the second semiconductor portion and the substrate by a first amount. The first amount may be greater than 0 and may be less than or equal to a thickness of the structural member.

The display device may include a black matrix. The first semiconductor portion may be positioned between the black matrix and the structural member in the direction perpendicular to the side of the substrate. The third semiconductor portion may be positioned over the structural member in a direction parallel to the side of the substrate.

An embodiment may be related to a method for manufacturing a transistor structure. The method may include the following steps: providing a first electrode; providing a second electrode; providing a third electrode; providing a substrate, which may overlap each of the first electrode and the second electrode; and providing a semiconductor member, which may overlap the third electrode and may include a first semiconductor portion, a second semiconductor portion, and a third semiconductor portion. The first semiconductor portion may directly contact the first electrode, may be directly connected to the third semiconductor portion, and may be connected through the third semiconductor portion to the second semiconductor portion. The second semiconductor portion may directly contact the second electrode and may be directly connected to the third semiconductor portion. A minimum distance between the first semiconductor portion and the substrate may be unequal to a minimum distance between the second semiconductor portion and the substrate.

According to embodiments, the horizontal area of a transistor in a pixel of an array substrate (or transistor structure) can be minimized, such that the aperture ratio of the pixel of the array substrate (or transistor structure) can be maximized. According to embodiments, a sufficient channel length in the transistor may be implemented, such that performance of the transistor may be desirable. Advantageously, satisfactory image display quality may be attained. In embodiments, the array substrate (or transistor structure) is suitable for a high-resolution display device.

Embodiments are not limited by the foregoing, and other effects are practical.

DETAILED DESCRIPTION OF EMBODIMENTS

Example embodiments to be are described in detail with reference to the accompanying drawings. Possible embodiments are not limited to the described embodiments and can be implemented in various forms.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

In this application, an "array substrate" may be a transistor structure or may include a transistor structure.

Figure 1:
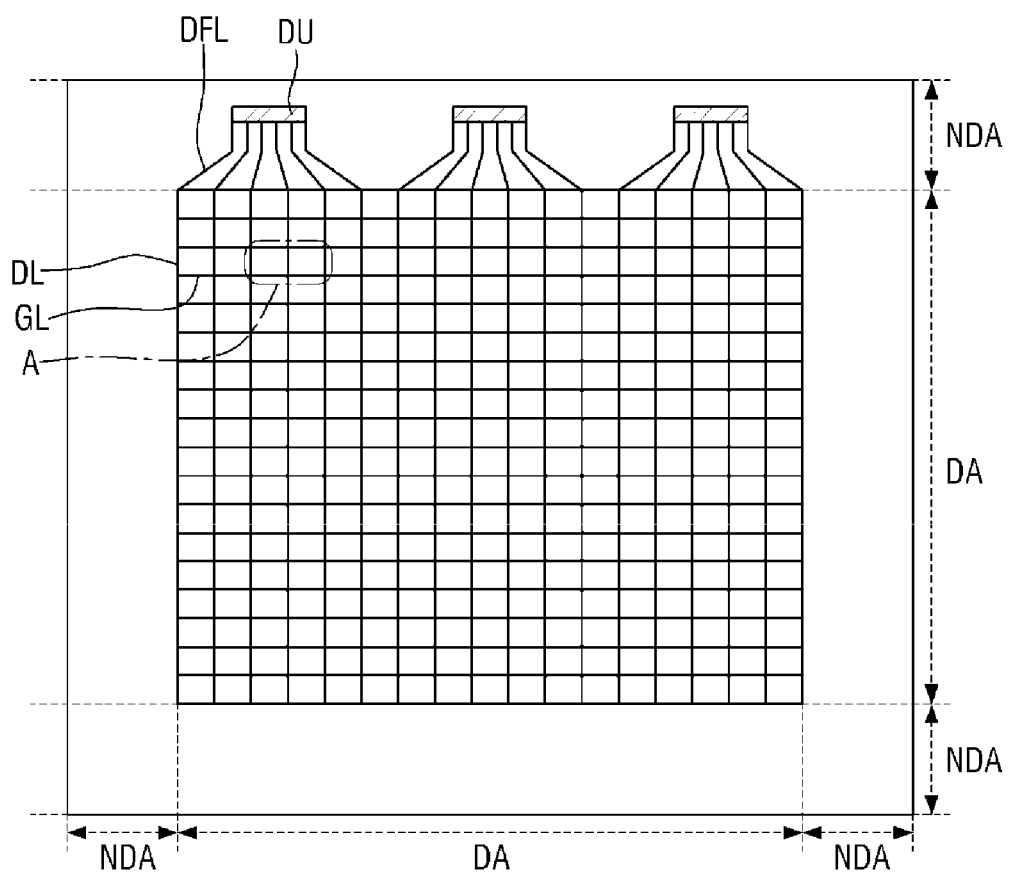
FIG. 1 is a schematic plan view of an array substrate (and/or a transistor structure) according to an embodiment.
Figure 2:
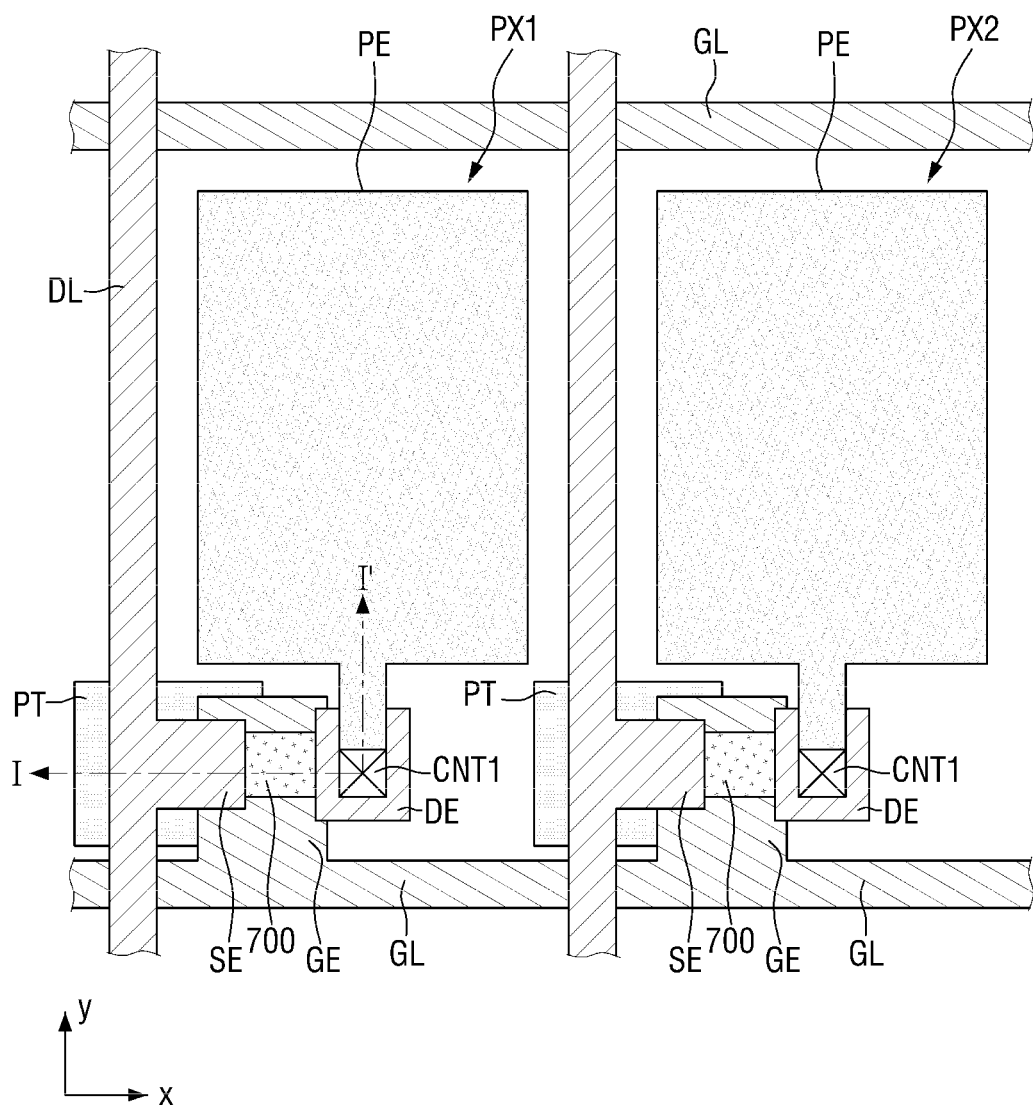
FIG. 2 is an enlarged plan view of the portion "A" of FIG. 1 according to an embodiment.
Figure 3:
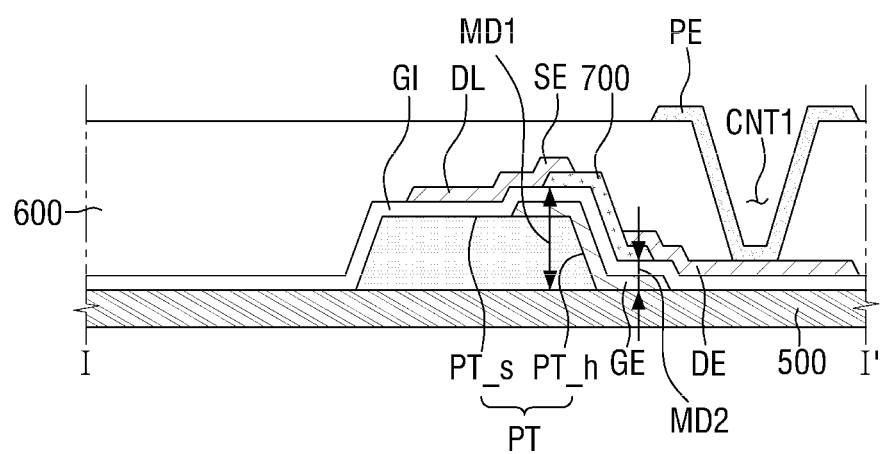
FIG. 3 is a cross-sectional view taken along the line I-I' of FIG. 2 according to an embodiment.

FIG. 1 is a schematic plan view of an array substrate (and/or a transistor substrate) according to an embodiment. FIG. 2 is an enlarged plan view of the portion "A" of FIG. 1. FIG. 3 is a cross-sectional view taken along the line I-I'.

Referring to FIGS. 1 to 3, the array substrate according to an embodiment includes a first substrate 500; a structural member PT disposed on the first substrate 500; a gate electrode GE disposed on the structural member PT; a source electrode SE and a drain electrode DE insulated from the gate electrode GE and spaced apart from each other; and a semiconductor member 700 disposed between the source electrode SE and the drain electrode DE.

The first substrate 500 may be made of a material having heat resistance and transparency. For example, the first substrate 500 may be made of transparent glass or plastic. A display area DA and a non-display area NDA are defined on the first substrate 500.

The display area DA is an area in which an image is displayed, and the non-display area NDA is an area in which various signal lines are arranged in order to display an image in the display area.

The non-display area NDA may be provided with a plurality of data drivers DU for providing data signals to data lines DL and a plurality of data fan-out lines DFL for transmitting the signals provided from the data drivers DU to the data line DL.

More specifically explaining the display area DA, a plurality of pixels formed by crossing a plurality of data lines DL and a plurality of gate lines GL with each other may be arranged on the display area DA. FIG. 2 is an enlarged plan view of one pixel (portion "A" of FIG. 1) of the plurality of pixels. The display area DA may include pixels, each of which is substantially the same as this pixel. For convenience of explanation, one pixel of adjacent pixels will be referred to as a first pixel PX1, and the other pixel thereof will be referred to as a second pixel PX2. The first pixel PX1 and the second pixel PX2 may have substantially the same shape, or may have shapes substantially symmetrical and/or analogous to each other. In an embodiment, since the first pixel PX1 and the second pixel PX2 have substantially the same shape in the embodiment of FIGS. 1 to 3, description of the first pixels (PX1) may be substantially applicable to the second pixels (PX2).

The structural member PT may be disposed on the first substrate 500. The structural member PT may protrude by a predetermined distance from/over the upper surface of the first substrate 500.

The structural member PT may include an upper surface PT_s and a lateral surface PT_h extending from an edge of the upper surface PT_s toward the upper surface of the first substrate 500. The upper surface PT_s of the structural member PT may include a substantially planarized and/or level surface, and the lateral surface PT_h of the structural member PT may include an inclined surface.

The upper end of the inclined surface of the lateral surface PT_h of the structural member PT may be in direct contact with the upper surface PT_s of the structural member PT, and the lower end of the inclined surface of the lateral surface PT_h of the structural member PT may be in direct contact with the upper surface of the first substrate 500. A cross section of the structural member PT may have a tapered shape (e.g., a substantially trapezoid shape). The angle between the lateral surface PT_h of the structural member PT and the upper surface of the first substrate 500 may be an obtuse angle.

A plurality of structural members PT may be provided, and each of the structural members PT may be disposed for one pixel PX. Specifically, the structural member PT may have an island shape, and may be disposed to be adjacent to a thin film transistor in one pixel PX.

For example, the protrusion structural member PT serves to support the source electrode SE and increase the level of the source electrode SE. The structural member PT may overlap the source electrode SE of the corresponding pixel PX.

The structural member PT may be made of an inorganic material containing, for example, at least of aluminum oxide ($Al_2O_3$), silicon nitride (SiNx), silicon oxide (SiOx), and silicon oxynitride (SiNO) and/or may be made of an organic material having high heat resistance.

The gate electrode GE may be disposed on the structural member PT. In this specification, the gate electrode GE and the gate line GL are collectively referred to as a gate wiring (GL, GE).

The gate line GL may receive and transmit signals for driving the corresponding transistor. The plurality of gate lines GL may extend in a first direction, for example, in the x-axis direction of FIG. 2. The gate electrode GE may be formed to protrude from the gate line GL, and may form three terminals of a thin film transistor together with the source electrode SE and drain electrode DE to be described later.

The gate electrode GE may be disposed to at least partially overlap the structural member PT. For example, the gate electrode GE may be disposed over the upper surface PT_s of the structural member PT, the lateral surface PT_h of the structural member PT, and the upper surface of the first substrate 500. Specifically, one end of the gate electrode GE may be disposed to be in contact with the upper surface PT_s of the structural member PT, and the other end of the gate electrode GE may be disposed to be in contact with the upper surface of the first substrate 500. Further, a part of the gate electrode GE may overlap the structural member PT in a horizontal direction. In this specification, "overlap in a vertical direction" or "overlap" means that two or more constituents at least partially overlap each other when viewed in a direction perpendicular to the upper surface of the first substrate 500, and "overlap in a horizontal direction" means that two or more constituents at least partially overlap each other when viewed in a direction parallel to the upper surface of the first substrate 500.

From the above viewpoint, the lateral surface PT_h of the structural member PT may overlap the gate electrode in a horizontal direction. A part of the gate electrode GE is disposed along the lateral surface PT_h of the structural member PT, and thus a part of the gate electrode GE may extend to have the same shape as the lateral surface PT_h of the structural member PT. In an exemplary embodiment in which the lateral surface PT_h of the structural member PT has an inclined surface, the gate electrode GE overlapping the inclined surface in a horizontal or vertical direction may include an inclined surface. In this case, the gradient of the inclined surface of the gate electrode GE may be substantially equal to the gradient of the lateral surface PT_h of the structural member PT. In this case, one end of the gate electrode GE may be disposed on the upper surface of the structural member PT, and the other end of the gate electrode GE may be disposed on the upper surface of the first substrate 500. In an embodiment, the other end of the gate electrode GE may be directly in contact with the upper surface of the first substrate 500.

A gate insulation film GI may be disposed on the first substrate 500, the structural member PT, and the gate electrode GE. The gate insulation film GI may be formed on the entire first substrate 500 to cover the first substrate 500, the structural member PT, and the gate electrode GE.

The gate insulation film GI may be made of at least one of inorganic insulating materials, such as silicon oxide (SiOx) and silicon nitride (SiNx), and organic insulating materials, such as benzocyclobutene (BCB), acrylic materials, and polyimide. However, these materials are illustrative, and the materials of the gate insulation film GI are not limited thereto.

The portion of the gate insulation film GI, this portion overlapping the lateral surface PT_h of the structural member PT in a horizontal or vertical direction, may be disposed along the shape of the lateral surface PT_h of the structural member PT. For example, when the lateral surface PT_h of the structural member PT has an inclined surface, the gate insulation film GI overlapping the this inclined surface may include an inclined surface disposed along the inclined surface of the lateral surface PT_h of the structural member PT.

The semiconductor member 700 may be disposed on the gate insulating film GI. The semiconductor member 700 may be disposed to at least partially overlap the source electrode SE and/or drain electrode DE to be described later.

The semiconductor member 700 may have an island shape, and may be disposed to entirely overlap the gate electrode GE. In an embodiment, only a part of the semiconductor member 700 may overlap the gate electrode GE.

An ohmic contact layer (not shown) doped with n-type impurities may be disposed on the semiconductor member 700. The ohmic contact layer may overlap the semiconductor member 700 entirely or partially. The ohmic contact lay may not be provided.

When the semiconductor member 700 is made of an oxide semiconductor, the semiconductor member 700 may contain zinc oxide (ZnO). In addition, the semiconductor member 700 may be doped with ions of one or more selected from gallium (Ga), indium (In), tin (Sn), zirconium (Zr), hafnium (Hf), cadmium (Cd), silver (Ag), copper (Cu), germanium (Ge), gadolinium (Gd), titanium (Ti), and vanadium (V). For example, the semiconductor member 700, which is made of an oxide semiconductor, may contain at least one of ZnO, ZnGaO, ZnInO, ZnSnO, GaInZnO, CdO, InO, GaO, SnO, AgO, CuO, GeO, GdO, HfO, TiZnO, InGaZnO, and InTiZnO.

In an embodiment, the semiconductor member 700 may contain a low-temperature polycrystalline silicon (LTPS) semiconductor. That is, the present invention is not limited by the kind of semiconductors contained in the semiconductor member 700, and various kinds of semiconductors, which is currently used or will be used in the future with the development of technology, can be applied to the semiconductor member 700.

The semiconductor member 700 may be formed to be conformal with the gate electrode GE. Specifically explaining this configuration, one end of the semiconductor member 700 may overlap the upper surface PT_s of the structural member PT, and the other end thereof may not overlap the upper surface PT_s of the structural member PT. The semiconductor member 700 may be formed on the gate insulation film GI overlapping the upper surface PT_s and lateral surface PT_h of the structural member PT, and thus the semiconductor member 700 may be disposed along the inclined surface formed by the lateral surface PT_h of the structural member PT and the gate insulating film GI. That is, a part of the semiconductor member 700 may overlap the lateral surface PT_h of the structural member PT in a horizontal direction.

A data wiring (DL, SE, DE) may be disposed on the gate insulation film GI and the semiconductor member 700. The data wiring may include a data line DL, a source electrode SE, and a drain electrode DE. The data line DL may extend in a second direction, that is, in the y-axis direction of FIG. 2, to cross a gate line GL.

The source electrode SE may be branched from the data line DL to extend to the upper portion of the semiconductor member 700, and the drain electrode DE may be disposed to be spaced apart from each other and face each other.

For example, the array substrate according to an embodiment may have a bottom gate structure in which the source electrode SE and the drain electrode DE are disposed over the gate electrode GE.

The data wiring (DL, SE, DE) may have a single-layer structure or multi-layer structure and may be made of one or more metals and/or one or more alloys, such as one or more of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), etc. and/or one or more alloys of some of titanium (Ti), zirconium (Zr), tungsten (W), tantalum (Ta), niobium (Nb), platinum (Pt), hafnium (Hf), etc. The data wiring may include one or more of oxygen (O), nitrogen (N), etc.

At least a part of the data wiring (DL, SE, and DE) may be disposed on the structural member PT.

FIG. 3 illustrates a case where the data line DL and the source electrode SE are formed over the structural member PT. That is, in the embodiment of FIG. 3, at least a part of the data line DL and the source electrode SE may overlap the upper surface PT_s of the structural member PT, and the drain electrode DE may not overlap the upper surface PT_s of the structural member PT. In other words, the lowermost surface of the data line DL and the source electrode SE may be located at a high position compared to the lowermost surface of the drain electrode DE. That is, the lowermost surface of the data line DL and the source electrode SE is located at a level different from the lowermost surface of the drain electrode DE. In this specification, the "lowermost surface" of an electrode refers to a surface located at the lowest position of lower surfaces of the electrode and/or an extending surface thereof. Further, the "level" refers to a height from the upper surface of the first substrate 500 to a predetermined plane.

One end of the source electrode SE and one end of the drain electrode DE may overlap the semiconductor member 700. Explaining this from the viewpoint of the semiconductor member 700, one end of the semiconductor member 700 may overlap the source electrode SE, and the other end thereof may overlap the drain electrode DE, with different minimum distances MD1 and MD2 from the first substrate 500.

The source electrode SE and the drain electrode DE are disposed at different levels and respectively contact different semiconductor end portions of the semiconductor member 700. Thus, the horizontal area of the semiconductor member 700 may be relatively small compared to when the source electrode SE and the drain electrode DE are located at the same level. Therefore, the horizontal area of a thin film transistor in one pixel may be minimized, and thus the aperture ratio of pixels may be maximized.

Further, when the portion of the semiconductor member 700 disposed between the source electrode SE and the drain electrode DE is disposed along the inclined surface formed by the structural member PT, the channel Ch of the semiconductor member 700 may be formed along the inclined surface. That is, the channel Ch may be formed between the source electrode SE overlapping one end of the semiconductor member 700 and the drain electrode DE overlapping the other end of the semiconductor member 700. In this case, the channel Ch can secure a sufficient length along the inclined surface, and thus it is possible to implement a thin film transistor having stable electrical characteristics.

A passivation film 600 may be disposed on the gate insulation film GI, the data line DL, the source electrode SE, the semiconductor member 700, and the drain electrode DE. The passivation film 600, which is a planarization film, is formed over the entire first substrate 500 to cover the data line DL, the source electrode SE, the semiconductor member 700, and the drain electrode DE. The passivation film 600 may be made of an organic insulating material or an inorganic insulating material.

The passivation film 600 may be provided with a first contact hole CNT1. The first contact hole CNT1 penetrates the passivation film 600 to at least partially expose the surface of the drain electrode DE.

A pixel electrode PE may be disposed on the passivation film 600. The pixel electrode PE may be electrically connected with the drain electrode DE through the first contact hole CNT1 penetrating the passivation film 600.

The pixel electrode PE may be made of a transparent conductor, such as indium tin oxide (ITO) or indium zinc oxide (IZO), or a reflective conductor, such as aluminum.

FIG. 2 illustrates a case of the pixel electrode PE having a flat plate shape, but the shape of the pixel electrode PE is not limited thereto. In an embodiment, the pixel electrode PE may be a structure having one or more slits. In an embodiment, one pixel may be provided with one or more pixel electrodes, and, in this case, voltages different from each other may be applied to the plurality of pixel electrodes.

Figure 4:
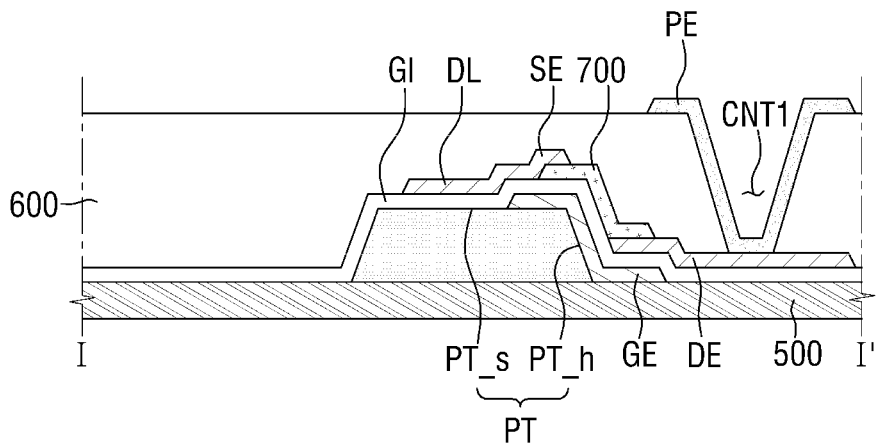
FIG. 4 is a cross-sectional view of an array substrate (and/or a transistor structure) according to an embodiment.

FIG. 4 is a cross-sectional view of an array substrate according to an embodiment.

Referring to FIG. 4, the array substrate according to an embodiment is different from the array substrate according to the embodiment of FIG. 3 in that one end of the semiconductor member 700 is in contact with the lower surface of the source electrode SE, and the other end of the semiconductor member 700 is in contact with the upper surface of the drain electrode DE.

Specifically, one end of the semiconductor member 700 may be disposed beneath the source electrode SE, and the other end thereof may be disposed on the drain electrode DE. This configuration may be due to the method of forming a source drain SE, a drain electrode DE and a semiconductor member 700, in which the drain electrode DE is first formed, the semiconductor member 700 is formed, and then the source electrode SE. That is, this configuration may be due to the method of sequentially forming the drain electrode DE-semiconductor member 700-source electrode SE. However, this configuration is set forth to illustrate the present invention, and the scope is not limited by such a process sequence.

Like this, when one end of the semiconductor member 700 is disposed beneath the source electrode SE and the other end thereof is disposed on the drain electrode DE, it is possible to secure a relatively long channel length compared to the channel length in the embodiment of FIG. 3. That is, a sufficient channel length necessary for driving a thin film transistor can be secured, thereby implementing a thin film transistor having excellent electrical characteristics.

Figure 5:
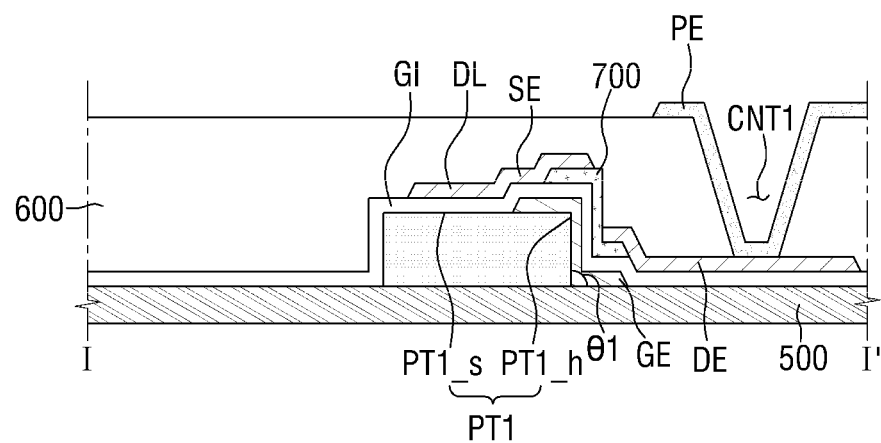
FIG. 5 is a cross-sectional view of an array substrate (and/or a transistor structure) according to an embodiment.

FIG. 5 is a cross-sectional view of an array substrate according to an embodiment.

Referring to FIG. 5, the array substrate according to an embodiment is different from the array substrate according to the embodiment of FIG. 3 in that the structural member PT1 has a substantially parallelepiped shape (e.g., a substantially rectangular cuboid shape).

The structural member PT1 may have a parallelepiped shape (e.g., a substantially rectangular cuboid shape). A cross section of the structural member PT1 may have a substantially rectangular shape. In this case, the angle between the lateral surface PT1_h of the structural member PT1 and the upper surface of the first substrate 500 may be a substantially right angle ($\theta$1).

When the angle between the lateral surface PT1_h of the structural member PT1 and the upper surface of the first substrate 500 is a substantially right angle, a part of the gate electrode GE disposed along the lateral surface PT1_h of the structural member PT1 may extend in a direction perpendicular to the upper surface of the first substrate 500.

Thus, a part of the semiconductor member 700 may also extend in a direction perpendicular to the upper surface of the first substrate 500. That is, the semiconductor member 700, the gate electrode GE, and the lateral surface PT1_h of the structural member PT1 may overlap in a horizontal direction.

Accordingly, a part of the channel Ch formed between the source electrode SE and the drain electrode DE may extend in a horizontal direction.

Figure 6:
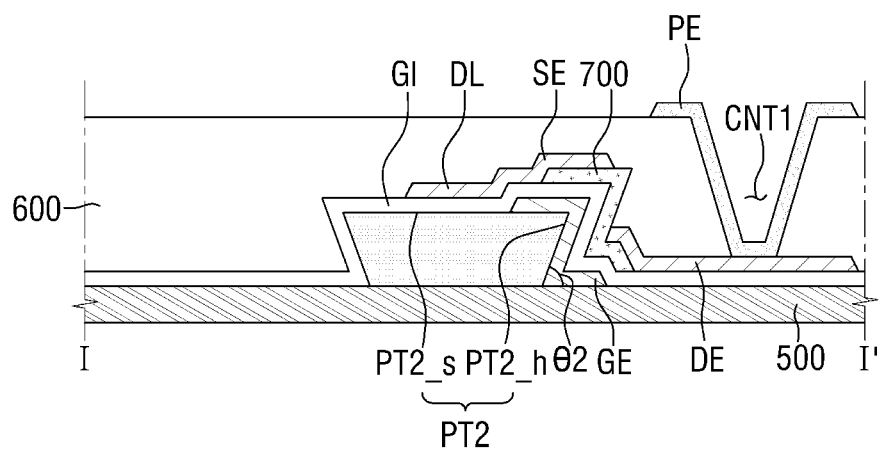
FIG. 6 is a cross-sectional view of an array substrate (and/or a transistor structure) according to an embodiment.

FIG. 6 is a cross-sectional view of an array substrate according to an embodiment.

Referring to FIG. 6, the array substrate according to an embodiment is different from the array substrate according to the embodiment of FIG. 3 in that a cross section of the structural member PT2 has an inverse tapered shape (e.g., a substantially trapezoid shape with a relatively short side positioned between the substrate and a relatively long side).

The cross-section of the structural member PT2 may have an inverse tapered shape. In other words, the angle between the lateral surface PT2_h of the structural member PT2 and the upper surface of the first substrate 500 may be an acute angle (θ2). In this case, the outer side of the upper surface PT2_s of the structural member PT2 may be disposed relatively outward compared to the outer side of the lower surface of the structural member PT2.

When the cross section of the structural member PT2 has an inverse tapered shape, a cross-section of the gate electrode GE (in contact with the lateral surface PT2_h of the structural member PT2) may have a Z shape. Accordingly, a cross section of a part of the semiconductor member 700 disposed adjacent to the gate electrode GE may also have tapered Z shape corresponding to the shape of the gate electrode GE.

Figure 7:
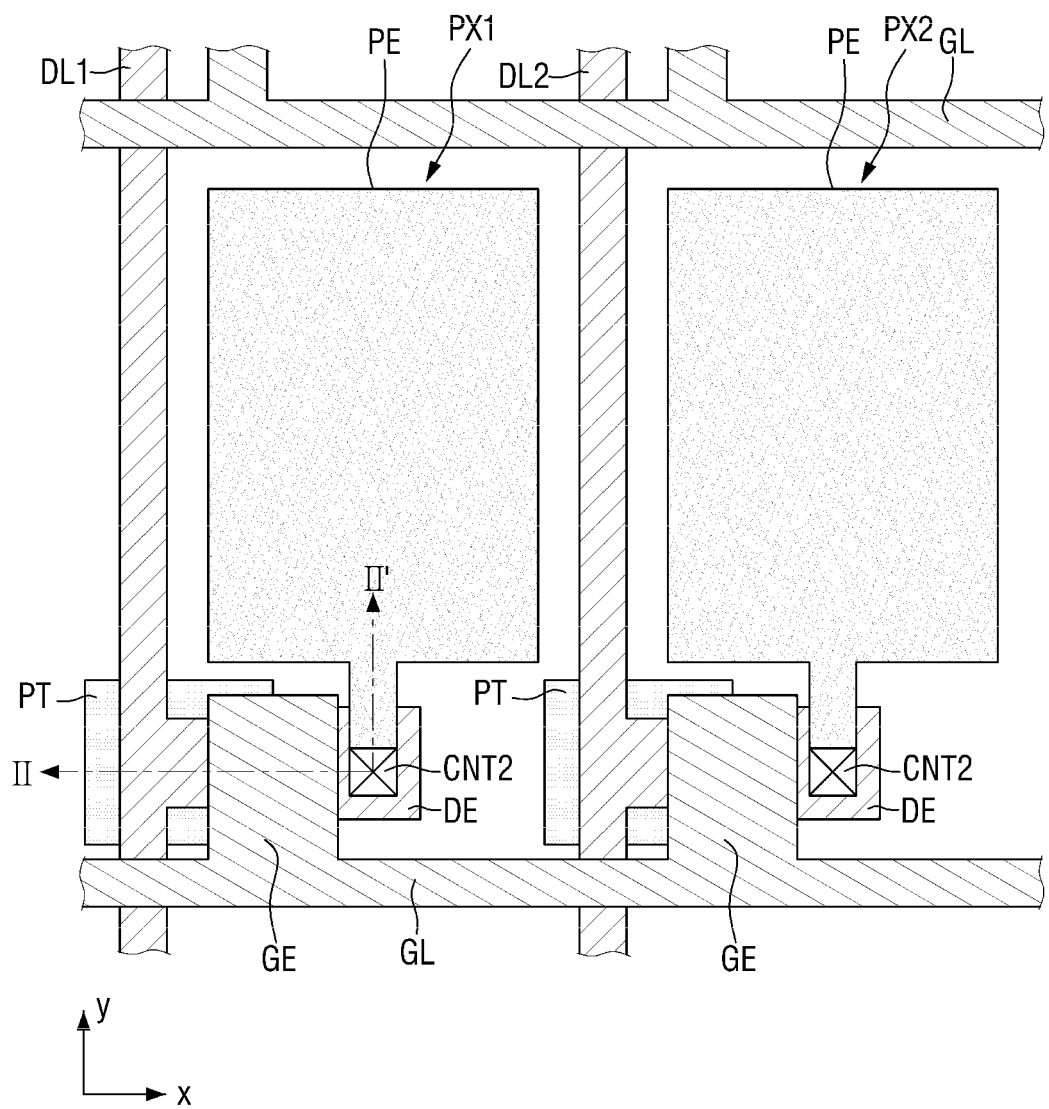
FIG. 7 is a plan view of an array substrate according (and/or a transistor structure) to an embodiment.
Figure 8:
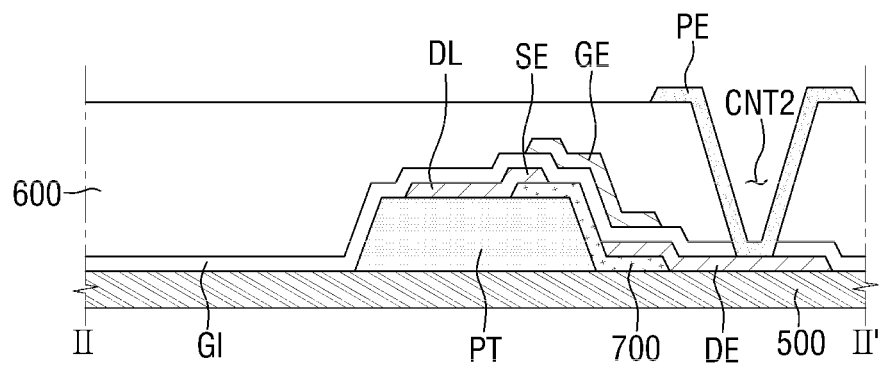
FIG. 8 is a cross-sectional view taken along the line II-II' of FIG. 7 according to an embodiment.

FIG. 7 is a plan view of an array substrate according to an embodiment. FIG. 8 is a cross-sectional view taken along the line II-II' of FIG. 7.

Referring to FIGS. 7 and 8, the array substrate according to an embodiment is different from the array substrate according to the embodiment of FIG. 2 in that the gate electrode GE is disposed over the source electrode SE and the drain electrode DE.

The array substrate according to an embodiment may have a top gate structure.

Specifically explaining this configuration, the semiconductor member 700 may be formed on the structural member PT.

FIG. 7 shows the first pixel PX1 and second pixel PX2 adjacent to each other. However, since the first pixel PX1 and the second pixel PX2 have substantially the same shape in the embodiment of FIG. 7, description of the first pixels (PX1) may be substantially applicable to the second pixels (PX2).

The semiconductor member 700 may be disposed to at least partially overlap the structural member PT. The semiconductor member 700 may be disposed over the upper surface PT_s of the structural member PT, the lateral surface PT_h of the structural member PT, and the upper surface of the first substrate 500. In other words, one end of the semiconductor member 700 may be in contact with the upper surface PT_s of the structural member PT, and the other end of the semiconductor member 700 may be in contact with the upper surface of the first substrate 500. Further, a part of the semiconductor member 700 may overlap the structural member PT in a horizontal direction.

Specifically, the lateral surface PT_h of the structural member PT may overlap the semiconductor member 700 in a horizontal direction. A part of the semiconductor member 700 is disposed along the lateral surface PT_h of the structural member PT, and thus a part of the semiconductor member 700 may extend to have the same shape as the lateral surface PT_h of the structural member PT. That is, in an exemplary embodiment in which the lateral surface PT_h of the structural member PT has an inclined surface, the semiconductor member 700 overlapping the inclined surface in a horizontal or vertical direction may include an inclined surface. In this case, the gradient of the inclined surface of the semiconductor member 700 may be substantially equal to the gradient of the lateral surface PT_h of the structural member PT.

A data wiring (DL, SE, and DE) may be disposed on the semiconductor member 700, the structural member PT, and the first substrate 500. At least a part of the data wiring (DL, SE, and DE) may be disposed on the structural member PT. FIG. 8 illustrates a case of the data line DL and the source electrode SE being formed on the structural member PT. That is, in the embodiment of FIG. 8, at least a part of the data line DL and the source electrode SE may overlap the upper surface PT_s of the structural member PT, and the drain electrode DE may not overlap the upper surface PT_s of the structural member PT.

In other words, even in this case, the lowermost surface of the data line DL and the source electrode SE may be located at a high position compared to the lowermost surface of the drain electrode DE. That is, the lowermost surface of the data line DL and the lower most surface of the source electrode SE are located at a level different from the lowermost surface of the drain electrode DE.

One end of the source electrode SE and one end of the drain electrode DE may overlap the semiconductor member 700. Explaining this configuration from the viewpoint of the semiconductor member 700, one end of the semiconductor member 700 may overlap the source electrode SE, and the other end thereof may overlap the drain electrode DE.

The source electrode SE and the drain electrode DE may be disposed at different levels and may contact different semiconductor end portions of the semiconductor member 700. Thus, the horizontal area of the semiconductor member 700 may be relatively small compared to when the source electrode SE and the drain electrode DE are located at the same level. Therefore, the horizontal area of a thin film transistor in one pixel may be minimized, and thus the aperture ratio of pixels may be maximized.

The gate insulation film GI may be disposed on the first substrate 500, the structural member PT, the source electrode SE, the semiconductor member 700, and the drain electrode DE. The gate insulation film GE may be formed on the entire first substrate 500 to cover the first substrate 500, the structural member PT, the source electrode SE, the semiconductor member 700, and the drain electrode DE.

The gate electrode GE may be formed on the gate insulation film GI. The gate electrode GE may be disposed adjacent to the semiconductor member 700. Specifically, the gate electrode GE may overlap the semiconductor member 700 in a vertical direction. The gate electrode GE may be formed to be conformal with the semiconductor member 700. Specifically explaining this configuration, one end of the gate electrode GE may overlap the upper surface PT_s of the structural member PT, and the other end of the gate electrode GE may not overlap the upper surface PT_s of the structural member PT.

Further, one end of the gate electrode GE may overlap the source electrode SE, and the other end of the gate electrode GE may overlap the drain electrode DE. That is, the gate electrode GE may be disposed along the inclined surface formed by the lateral surface PT_h of the structural member PT and the gate insulation film GI formed on the lateral surface PT_h thereof, and thus a part of the gate electrode GE may include an inclined surface. In this case, the gradient of the inclined surface of the gate electrode GE may be substantially equal to the gradient of the inclined surface of the lateral surface PT_h of the structural member PT. In this case, the gate electrode GE may overlap the lateral surface PT_h of the structural member PT in a horizontal direction.

When the semiconductor member 700 disposed between the source electrode SE and the drain electrode DE is disposed along the inclined surface formed by the structural member PT, the channel Ch of the semiconductor member 700 may be formed along the inclined surface. That is, the channel Ch may be formed between the source electrode SE overlapping one end of the semiconductor member 700 and the drain electrode DE overlapping the other end of the semiconductor member 700. In this case, the channel Ch can secure a sufficient length along the inclined surface, and thus it is possible to implement a thin film transistor having stable electrical characteristics.

The passivation film 600 may be disposed on the gate insulation film GI and the gate electrode GE. Since the passivation film 600 is substantially the same as those having been described in the array substrates according to some embodiments, detailed description thereof will be omitted.

A second contact hole CNT2 may be disposed in the passivation film 600. Specifically, the second contact hole CNT2 penetrates the passivation film 600 and the gate insulation film GI to at least partially expose the surface of the drain electrode DE.

The pixel electrode PE may be disposed on the second contact hole CNT2. The pixel electrode PE may be electrically connected with the drain electrode DE through the second contact hole CNT1.

Figure 9:
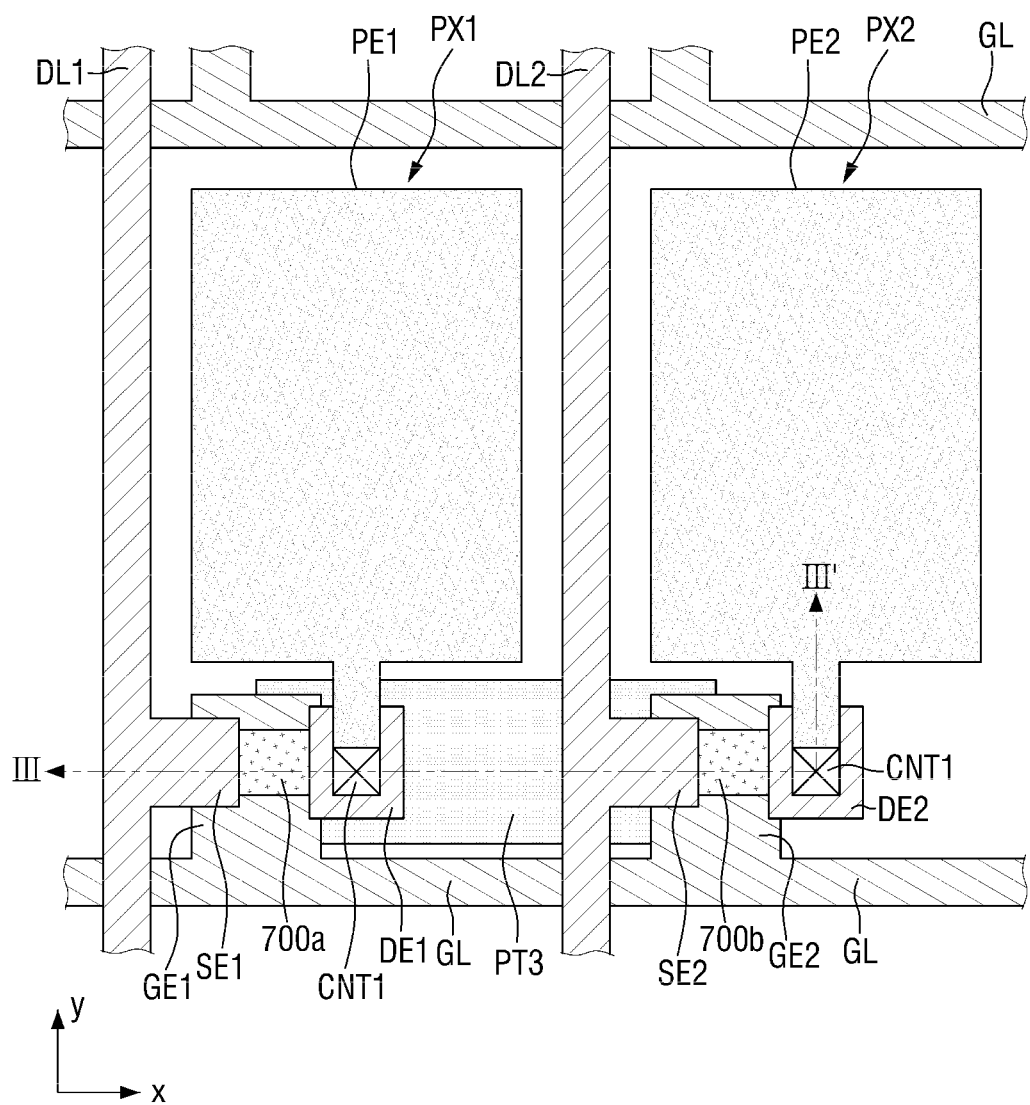
FIG. 9 is a plan view of an array substrate (and/or a transistor structure) according to an embodiment.
Figure 10:
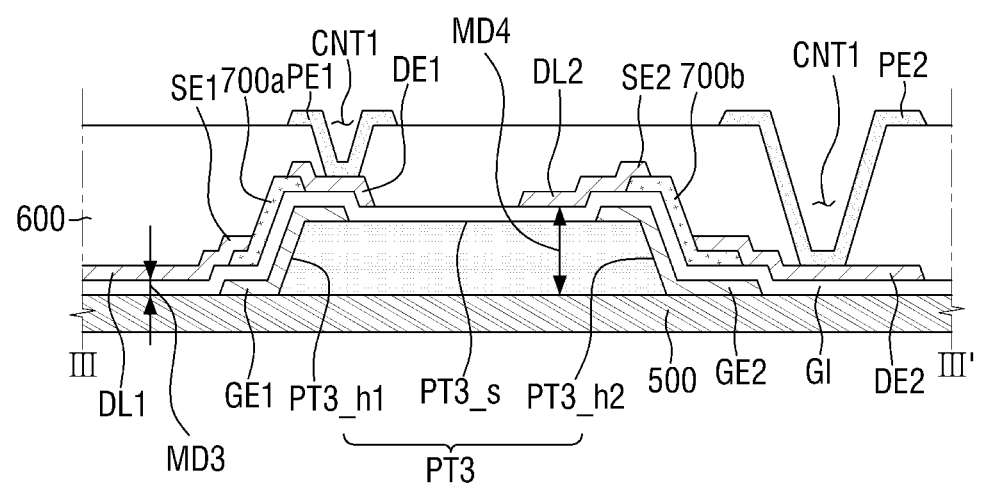
FIG. 10 is a cross-sectional view taken along the line III-III' of FIG. 9 according to an embodiment.

FIG. 9 is a plan view of an array substrate according to an embodiment. FIG. 10 is a cross-sectional view taken along the line III-III' of FIG. 9.

Referring to FIGS. 9 and 10, the array substrate according to an embodiment includes a first substrate 500, a first pixel electrode PX1 and a second pixel electrode PX2 disposed on the first substrate 500 to be adjacent to each other, and a structural member PT3 including an upper surface PT3_s projected from the upper surface of the first substrate 500 and a lateral surface PT3_h extending from the upper surface PT3_s toward the upper surface of the first substrate 500. Here, the first pixel PX1 includes a first gate electrode GE1 disposed on the structural member PT3, a first source electrode SE1 and a first drain electrode DE1 insulated from the first gate electrode GE1 and disposed to be spaced apart from each other, and a first semiconductor member 700a disposed between the first source electrode SE1 and the first drain electrode DE1. The second pixel PX2 includes a second gate electrode GE1 disposed on the structural member PT3, a second source electrode SE2 and a second drain electrode DE2 insulated from the second gate electrode GE2 and disposed to be spaced apart from each other, and a second semiconductor member 700b disposed between the second source electrode SE2 and the second drain electrode DE2. Any one selected from the first source electrode SE1 and the first drain electrode DE1 and any one selected from the second source electrode SE2 and the second drain electrode DE2 are disposed on the upper surface PT3_s of the structural member PT3.

The structural member PT3 may be disposed over the first pixel PX1 and the second pixel PX2. In other words, the first pixel PX1 and the second pixel PX2 may share one structural member PT3.

For the convenience of explanation, the data line included in the first pixel PX1 is referred to as a first data line DL1, the gate electrode included in the first pixel PX1 is referred to as a first gate electrode GE1, the source electrode included in the first pixel PX1 is referred to as a first source electrode SE1, the drain electrode included in the first pixel PX1 is referred to as a first drain electrode DE1, and the semiconductor member included in the first pixel PX1 is referred to as a first semiconductor member 700a.

Similarly to this, the data line included in the second pixel PX2 is referred to as a second data line DL2, the gate electrode included in the second pixel PX2 is referred to as a second gate electrode GE2, the source electrode included in the second pixel PX2 is referred to as a second source electrode SE2, the drain electrode included in the second pixel PX2 is referred to as a second drain electrode DE2, and the semiconductor member included in the second pixel PX2 is referred to as a second semiconductor member 700b.

Based on this, explaining the array substrate according to an embodiment, the structural member PT3 may be disposed on the first substrate 500. The structural member PT3 may be disposed over the first pixel PX1 and the second pixel PX2. Specifically, one side of the structural member PT3 may be disposed on the first pixel PX1, and the other side of the structural member PT3 may be disposed on the second pixel PX2.

The structural member PT3 may include an upper surface PT3_s projected from the upper surface of the first substrate 500 at a predetermined distance, a first lateral surface PT3_h1 extending from one side of the upper surface PT3_s toward the upper surface of the first substrate 500, and a second lateral surface PT3_h2 extending from the other side of the upper surface PT3_s toward the upper surface of the first substrate 500.

The first gate electrode GE1 may be disposed on the first lateral surface PT3_h1, and the second gate electrode GE2 may be disposed on the second lateral surface PT3_h2. Each of the first gate electrode GE1 and the second gate electrode GE2 may at least partially overlap the structural member PT. Specifically, the first gate electrode GE1 may be disposed over the upper surface of the first substrate 500, the first lateral surface PT3_h1 of the structural member PT, and the upper surface PT3_s of the structural member PT. Similarly to this, the second gate electrode GE2 may be disposed over the upper surface of the first substrate 500, the second lateral surface PT3_h2 of the structural member PT, and the upper surface PT3_s of the structural member PT.

In other words, one end of the first gate electrode GE1 may overlap the upper surface PT3_s of the structural member PT, and the other end of the first gate electrode GE1 may not overlap the upper surface PT3_s of the structural member PT. Similarly to this, one end of the second gate electrode GE2 may overlap the upper surface PT3_s of the structural member PT, and the other end of the second gate electrode GE1 may not overlap the upper surface PT3_s of the structural member PT.

Specifically, the first lateral surface PT3_h1 and second lateral surface PT3_h2 of the structural member PT may overlap the first gate electrode GE1 and the second gate electrode GE2, respectively. A part of the first gate electrode GE1 and a part of the second gate electrode GE2 may be disposed along the first lateral surface PT3_h1 and second lateral surface PT3_h2 of the structural member PT, respectively, and thus may extend to have the same shape as the first lateral surface PT3_h1 and second lateral surface PT3_h2 of the structural member PT. In an exemplary example in which each of the first lateral surface PT3_h1 and the second lateral surface PT3_h2 has an inclined surface, each of the first gate electrode GE1 and second gate electrode GE2 overlapping the inclined surface in a horizontal or vertical direction may have an inclined surface. In this case, the gradient of the inclined surface of each of the first gate electrode GE1 and second gate electrode GE2 may be substantially equal to the gradient of the inclined surface of each of the first lateral surface PT3_h1 and the second lateral surface PT3_h2.

A gate insulation film GI may be disposed on the first substrate 500, the structural member PT3, the first gate electrode GE1, and the second gate electrode GE2. The gate insulation film GI may be formed on the entire first substrate 500 to cover the first substrate 500, the structural member PT3, the first gate electrode GE1, and the second gate electrode GE2.

The gate insulation film GI may be made of at least one inorganic insulating material, such as silicon oxide (SiOx) and/or silicon nitride (SiNx), and/or one or more organic insulating materials, such as one or more of benzocyclobutene (BCB), acrylic materials, and polyimide. However, these materials are illustrative, and the materials of the gate insulation film GI are not limited thereto.

A portion which horizontally or vertically overlaps the first lateral surface PT3_h1 and the second lateral surface PT3_h2 of the structural member PT3 in the gate insulation film GI may be disposed along the shape of the first lateral surface PT3_h1 and the second lateral surface PT3_h2 of the structural member PT3. Each of the first lateral surface PT3_h1 and the second lateral surface PT3_h2 of the structural member PT3 may include an inclined surface, and the gate insulation film GI (overlapping the inclined surfaces of the structural member PT3) may include inclined surfaces disposed along the inclined surfaces of the first lateral surface PT3_h1 and the second lateral surface PT3_h2 of the structural member PT3.

First and second semiconductor members 700a and 700b may be disposed on the gate insulation film GI. The semiconductor member 700 may be disposed to at least partially overlap first and second source electrodes SE1 and SE2 and/or first and second drain electrodes DE1 and DE2 to be described later.

The first and second semiconductor members 700a and 700b may be formed on the gate insulation film GI, which overlaps the upper surface PT3_s, the first lateral surface PT3_h1, and the second lateral surface PT3_h2 of the structural member PT3. Accordingly, the first semiconductor member 700a may be disposed along the inclined surface formed by the first lateral surface PT3_h1 of the structural member PT3 and the gate insulation film GI. Similarly to this, the second semiconductor member 700b may be disposed along the inclined surface formed by the second lateral surface PT3_h2 of the structural member PT3 and the gate insulation film GI.

Accordingly, a part of the first and second semiconductor members 700a and 700b may overlap the first lateral surface PT3_h1 and the second lateral surface PT3_h2 of the structural member PT3 in a horizontal direction.

In a first pixel PX1, on the gate insulation film GI and the first semiconductor member 700a, a first data line DL, a first source electrode SE1, and a first drain electrode DE1 may be disposed.

At least one of the first data line DL, the first source electrode SE1, and the first drain electrode DE1 may be disposed on the upper surface PT3_h of the structural member PT3.

FIG. 10 illustrates a case where the first drain electrode DE1 is formed on the structural member PT3. That is, in an embodiment of FIG. 10, at least a part of the first drain electrode DE1 at least partially overlaps the upper surface PT3_h of the structural member PT3, and the first data line DL and the first source electrode SE1 may not overlap the upper surface PT3_h of the structural member PT3.

In other words, the lowermost surface of the first data line DL1 and the first source electrode SE1 may be located at a low position compared to the lowermost surface of the first drain electrode DE1. That is, the lowermost surface of the first data line DL1 and the first source electrode SE1 may be located at a level different from the lowermost surface of the first drain electrode DE1. In this specification, the "lowermost surface" of an electrode refers to a surface located at the lowest position of lower surfaces of the electrode and/or an extending surface thereof.

In a second pixel PX1, on the gate insulation film GI and the second semiconductor member 700b, a second data line DL2, a second source electrode SE2, and a second drain electrode DE2 may be disposed.

At least one of the second data line DL2, the second source electrode SE2, and the second drain electrode DE2 may be disposed on the upper surface PT3_h of the structural member PT3.

FIG. 10 illustrates a case where the second data line DL2 and the second source electrode SE2 are formed on the upper surface PT3_h of the structural member PT3. That is, unlike the first pixel PX1, in the second pixel PX2, a part of the second data line DL2 and the second source electrode SE2 is disposed on the upper surface PT3_h of the structural member PT3. That is, in the embodiment of FIG. 10, at least a part of the second data line DL2 and the second source electrode SE2 at least partially overlaps the upper surface PT3_h of the structural member PT3, and the second drain electrode DE2 may not overlap the upper surface PT3_h of the structural member PT3.

In other words, the lowermost surface of the second data line DL2 and the second source electrode SE2 may be located at a high position compared to the lowermost surface of the second drain electrode DE2. That is, the lowermost surface of the second data line DL2 and the second source electrode SE2 may be located at a level different from the lowermost surface of the second drain electrode DE2.

In this case, the first data line DL1 and the second data line DL2 may be disposed on different levels. Illustratively, the first data line DL1 may be positioned at a relatively high level compared to the second data line DL2.

One end of the first source electrode SE1 and one end of the first drain electrode DE1 may overlap the first semiconductor member 700a. When describing this in terms of the first semiconductor member 700a, one end of the first semiconductor member 700a overlaps the first source electrode SE1 and the other end thereof may overlap the first drain electrode DEL A minimum distance between the first source electrode SE1 and the first substrate 500 is MD3; a minimum distance between the second data line DL2 and the first substrate 500 is MD4.

Similarly to this, one end of the second source electrode SE2 and one end of the second drain electrode DE2 may overlap the second semiconductor member 700b. When describing this in terms of the second semiconductor member 700b, one end of the second semiconductor member 700b overlaps the second source electrode SE2 and the other end thereof may overlap the second drain electrode DE2.

As such, when the first pixel PX1 and the second pixel PX2 share the structural member PT3, in the first pixel PX1 and the second pixel PX2, the horizontal area of the thin film transistors may be decreased. That is, the thin film transistor may be disposed by using a relatively small horizontal area. Thus, the aperture ratio of each pixel may be relatively increased.

A passivation film 600 may be disposed on the gate insulation film GI, the first and second data lines DL1 and DL2, the first and second source electrodes SE1 and SE2, the first and second semiconductor members 700*a* and 700*b*, and the first and second drain electrodes DE 1 and DE2.

The passivation film 600, which is a planarization film, covers the gate insulation film GI, the first and second data lines DL1 and DL2, the first and second source electrodes SE1 and SE2, the first and second semiconductor members 700*a* and 700*b*, and the first and second drain electrodes DE 1 and DE2 and may be entirely formed on the first substrate 500. The passivation film 600 may be made of an organic insulating material or an inorganic insulating material.

On the first pixel PX1 and the second pixel PX2, a third contact hole CNT3 and a fourth contact hole CNT4 may be disposed, respectively. The third contact hole CNT3 and the fourth contact hole CNT4 may at least partially expose the surface of the first and second drain electrodes DE 1 and DE2 through the passivation film 600.

In an embodiment, the third contact hole CNT3 may be disposed on the structural member PT3. That is, the third contact hole CNT3 may overlap the structural member PT3. In this case, a vertical depth of the third contact hole CNT3 may be smaller than a vertical depth of the fourth contact hole CNT4. In other words, a level of the lowermost surface of the third contact hole CNT3 may be higher than a level of the lowermost surface of the fourth contact hole CNT4.

First and second pixel electrodes PE1 and PE2 may be disposed on the passivation film 600.

The first and second pixel electrodes PE1 and PE2 may be electrically connected with the drain electrode DE through the first contact hole CNT1 penetrating the passivation film 600.

In this case, due to a level difference between the first drain electrode DE1 and the second drain electrode DE2, a contact surface between the first pixel electrode PE1 and the first drain electrode DE1 may be located at a relatively high portion compared to a contact surface between the second pixel electrode PE2 and the second drain electrode DE2. That is, the contact surface between the first pixel electrode PE1 and the first drain electrode DE1 may be located on a higher level than the contact surface between the second pixel electrode PE2 and the second drain electrode DE2.

Figure 11:
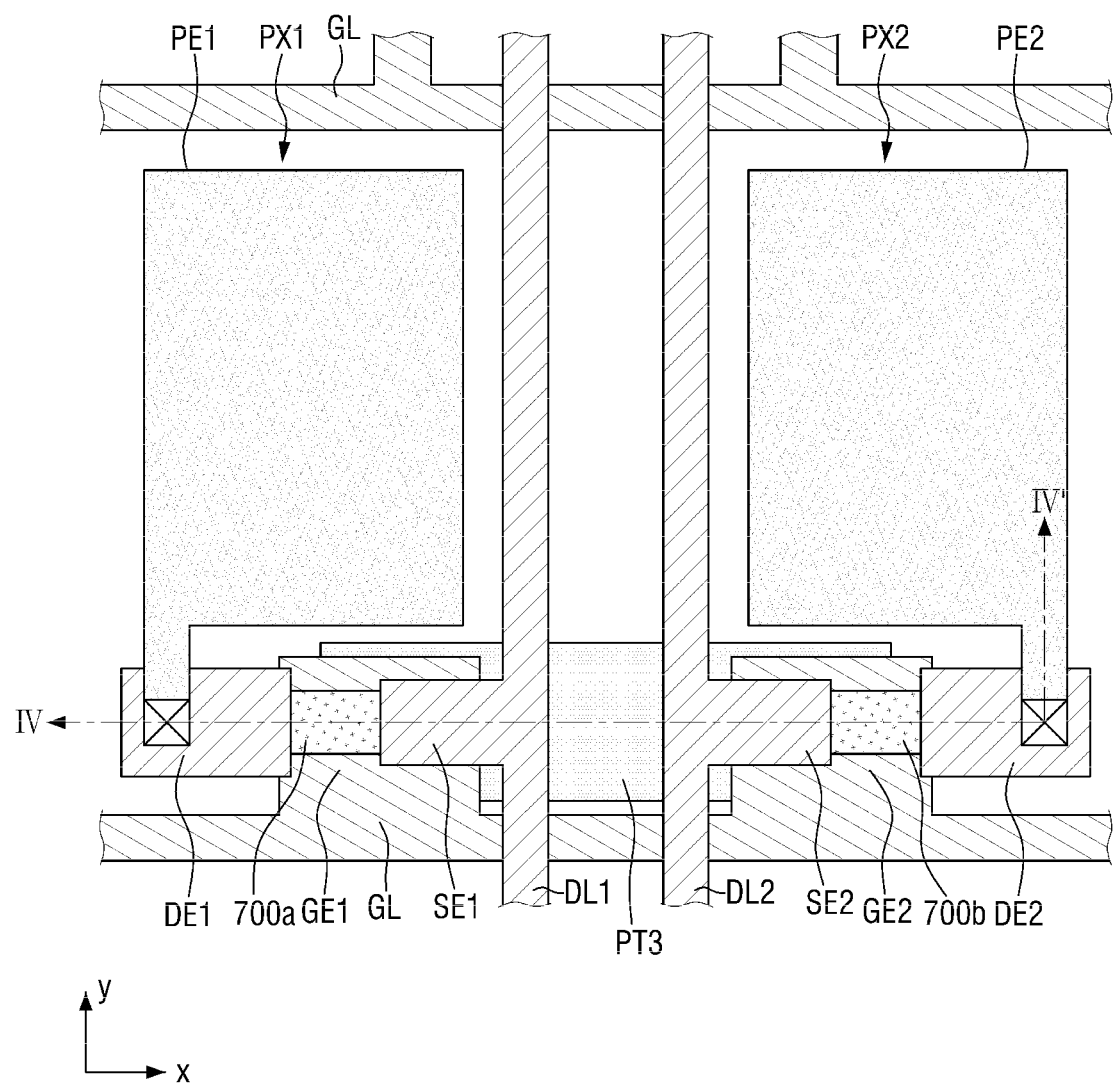
FIG. 11 is a plan view of an array substrate (and/or a transistor structure) according to an embodiment.
Figure 12:
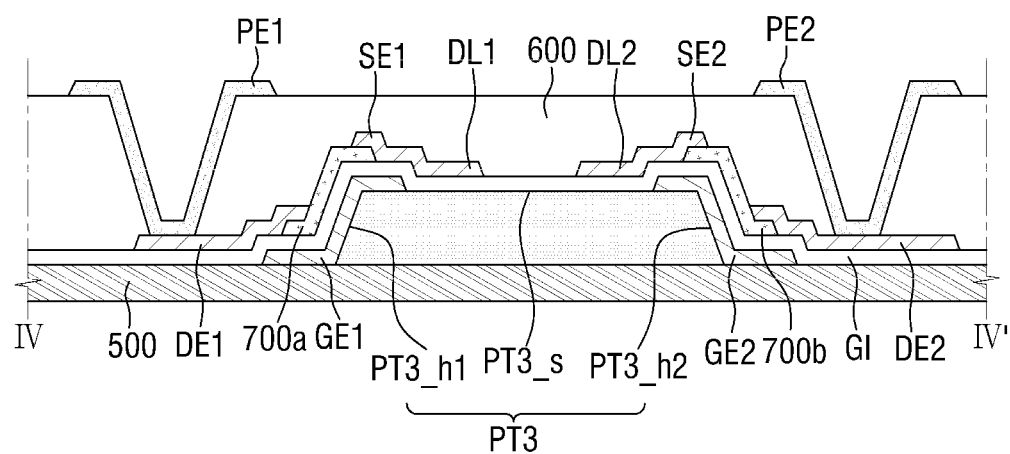
FIG. 12 is a cross-sectional view taken along the line IV-IV' of FIG. 11 according to an embodiment.

FIG. 11 is a plan view of an array substrate according to an embodiment. FIG. 12 is a cross-sectional view taken along line IV-IV of FIG. 11.

Referring to FIGS. 11 and 12, the array substrate according to an embodiment is different from the embodiment of FIG. 10 in that the first pixel electrode PE1 and the second pixel electrode PE2 are substantially symmetrical to each other with reference to a combination of the first data line DL1 and the second data line DL2.

Illustratively, the first data line DL1 and the second data line DL2 may be disposed to be adjacent to each other. In this case, the first pixel PX1 and the second pixel PX2 may have a symmetrical shape.

Specifically, a part of the first data line DL1 and the second data line DL2 may be disposed on the upper surface PT3_*s* of the structural member PT3. That is, the first data line DL1 and the second data line DL2 may be disposed on the same level.

In addition, the first pixel PX1 and the second pixel PX2 may be symmetrical to each other on the same level.

Further, the first data line DL1 of the first pixel PX1, the first gate electrode GE1, the first source electrode SE1, the first drain electrode DE1, and the first semiconductor member 700*a* may be symmetrical to the second data line DL2 of the second pixel PX2, the second gate electrode GE2, the second source electrode SE2, the second drain electrode DE2, and the second semiconductor member 700*a*.

On the first pixel PX1 and the second pixel PX2, a fifth contact hole CNT5 and a sixth contact hole CNT6 may be disposed, respectively. The fifth contact hole CNT5 and the sixth contact hole CNT6 may at least partially expose the surface of the first and second drain electrodes DE1 and DE2 through the passivation film 600.

The fifth contact hole CNT5 and the sixth contact hole CNT6 may be substantially symmetrical to each other with reference to the structural member PT. Further, the vertical depths of the fifth contact hole CNT5 and the sixth contact hole CNT6 may be the same as each other.

Figure 13:
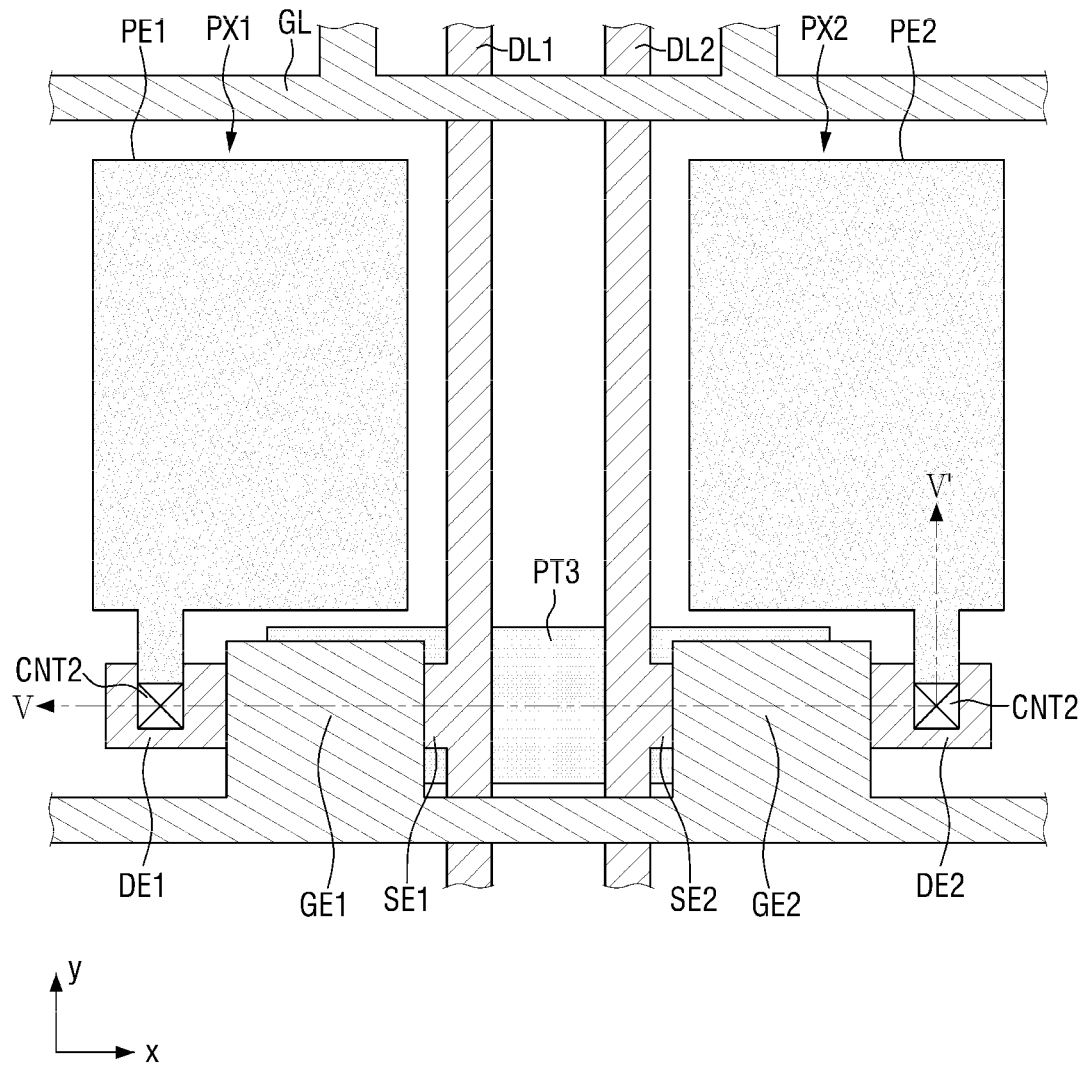
FIG. 13 is a plan view of an array substrate (and/or a transistor structure) according to an embodiment.
Figure 14:
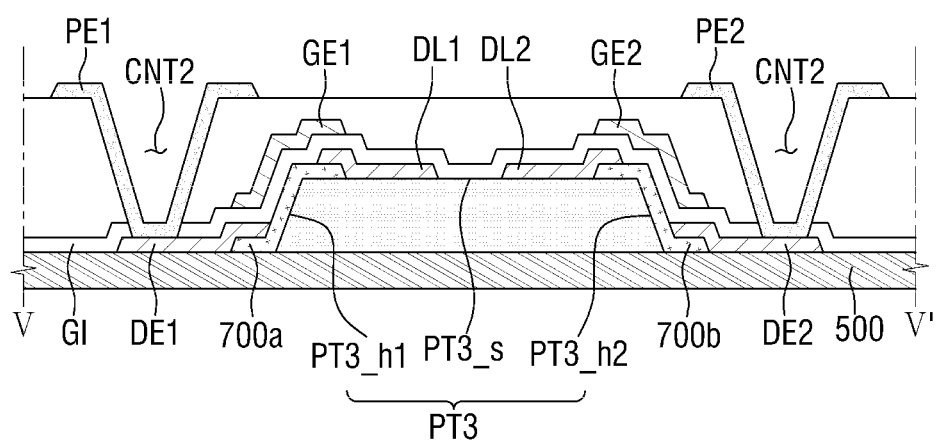
FIG. 14 is a cross-sectional view taken along the line V-V' of FIG. 13 according to an embodiment.

FIG. 13 is a plan view of an array substrate according to an embodiment. FIG. 14 is a cross-sectional view taken along line V-V of FIG. 13.

Referring to FIGS. 13 and 14, the array substrate according to an embodiment is different from the embodiment of FIG. 12 in that the structural member PT3 is disposed over the first pixel PX1 and the second pixel PX2, and the first pixel PX1 and the second pixel PX2 have a top gate type.

As described above, the array substrates according to some embodiments may have a top gate structure. In the embodiment of FIG. 13, the structural member PT3 may be substantially the same as the structural member PT3 described in FIG. 12. Accordingly, a detailed description thereof will be omitted.

Further, the top gate structure of the first pixel PX1 may be substantially the same as the top gate structure described in FIG. 8. Accordingly, a detailed description thereof will be omitted.

Further, a part of the first data line DL1 and the second data line DL2 may be disposed on the upper surface PT3_*s* of the structural member PT3. That is, the first data line DL1 and the second data line DL2 may be disposed on the same level.

In addition, the first pixel PX1 and the second pixel PX2 may be symmetrical to each other on the same level.

Further, the first data line DL1 of the first pixel PX1, the first gate electrode GE1, the first source electrode SE1, the first drain electrode DE1, and the first semiconductor member 700*a* may be substantially symmetrical and/or analogous to the second data line DL2 of the second pixel PX2, the second gate electrode GE2, the second source electrode SE2, the second drain electrode DE2, and the second semiconductor member 700*a*.

That is, the embodiment of FIG. 12 is different from the embodiment of FIG. 11 in that the thin film transistors of the first pixel PX1 and the second pixel PX2 have the top gate structure.

In addition, FIG. 12 illustrates a case where the first data line DL1 and the second data line DL2 are disposed on the same level. In an embodiment, as illustrated in FIG. 10, the first data line DL1 and the second data line DL2 may be disposed on different levels.

Figure 15:
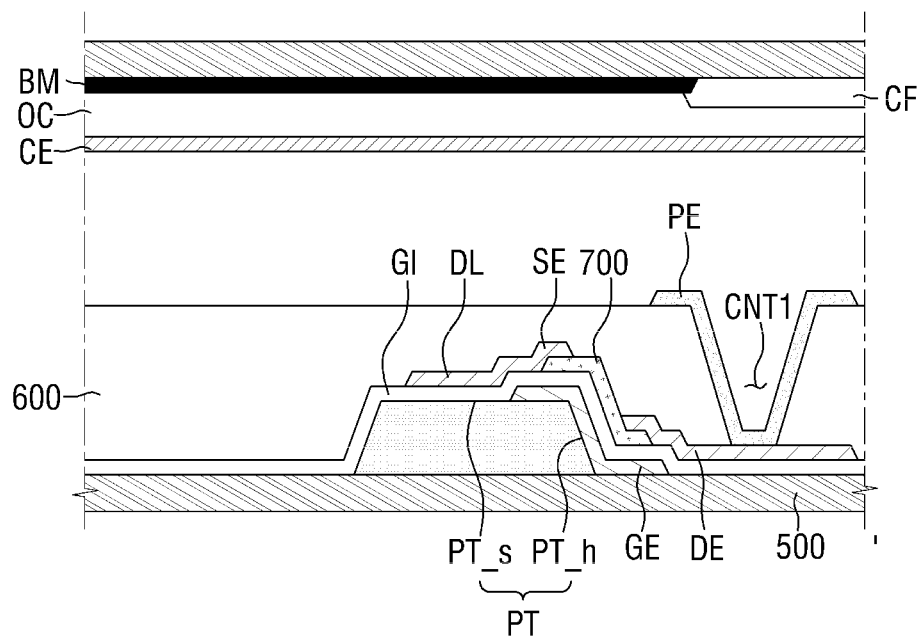
FIG. 15 is a cross-sectional view of a display device, e.g., a liquid crystal display device, according to an embodiment.

FIG. 15 is a cross-sectional view of a liquid crystal display device according to an embodiment.

Referring to FIG. 15, a liquid crystal display device according to an embodiment includes a first substrate 500, a structural member PT that is disposed on the first substrate 500 and includes an upper surface PT_s projected from the upper surface of the first substrate 500 and a lateral surface extended from the upper surface PT_s toward the upper surface of the first substrate 500, a gate electrode GE disposed on the structural member PT, a source electrode SE and a drain electrode DE insulated from the gate electrode GE and spaced apart from each other, a semiconductor member 700 disposed between the source electrode SE and the drain electrode DE, and a second substrate 1000 facing the first substrate 500.

The first substrate 500, the structural member PT that is disposed on the first substrate 500 and includes the upper surface PT_s projected from the upper surface of the first substrate 500 and the lateral surface extended from the upper surface PT_s toward the upper surface of the first substrate 500, the gate electrode GE disposed on the structural member PT, the source electrode SE and the drain electrode DE insulated from the gate electrode GE and spaced apart from each other, and the semiconductor member 700 disposed between the source electrode SE and the drain electrode DE are substantially the same as those described in the array substrate according to some embodiments of the present invent above. Accordingly, a detailed description thereof will be omitted.

The second substrate 1000 may be disposed to face the first substrate 500.

The second substrate 1000 may be made of a material having heat resistance and transparency. For example, the second substrate 1000 may be made of transparent glass or plastic.

A black matrix BM and a color filter CF may be disposed on the second substrate 1000. The black matrix BM may serve to suppress light leakage between pixels and light interference between adjacent pixels. The black matrix BM may be disposed to overlap the source electrode SE, the drain electrode DE, and the semiconductor member 700 which are disposed on the first substrate 500. In addition, the black matrix BM may also cover the data line DL and/or the gate line GL.

The color filter CF may be disposed to overlap a pixel electrode PE of each pixel. The color filter CF may include at least one color filter of a red color filter, a blue color filter, and a green color filter.

An overcoat OC may be disposed on the color filter CF and the black matrix BM. The overcoat OC may be made of an organic or inorganic insulating material. The overcoat OC may be formed over the entire area of the second substrate 1000 and serve as a planarization film.

A common electrode CE may be disposed on the overcoat OC. The common electrode CE may be a non-membered front electrode. Common voltage may be applied to the common electrode CE. When different voltages are applied to the common electrode CE and the pixel electrode PE, a constant electric field is formed between the common electrode CE and the pixel electrode PE to control movement of the liquid crystal disposed between the first substrate 500 and the second substrate 1000.

Figure 16:
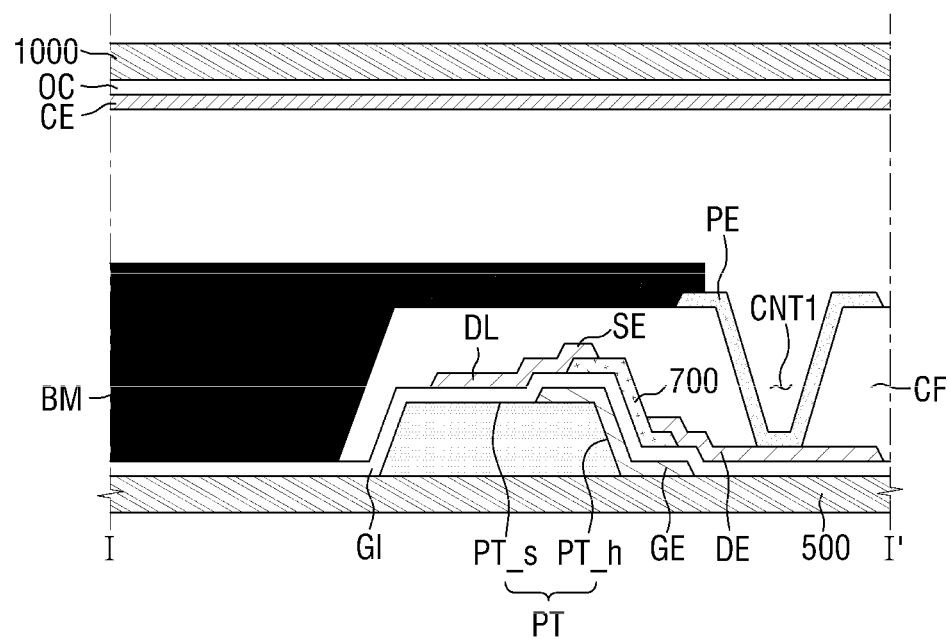
FIG. 16 is a cross-sectional view of a display device, e.g., a liquid crystal display device, according to an embodiment.

FIG. 16 is a cross-sectional view of a liquid crystal display device according to an embodiment.

Referring to FIG. 16, a liquid crystal display device according to an embodiment is different from the embodiment of FIG. 15 in that the black matrix BM and the color filter CF are formed on the first substrate 500.

That is, the liquid crystal display device according to an embodiment may be a liquid crystal display device having a color filter on array.

Specifically, the color filter CF may be disposed on the pixel electrode PE. The color filter CF may overlap one pixel electrode PE and be extended to a portion with the thin film transistor. The black matrix BM may be disposed at the remaining portion except for the portion with the thin film transistor. That is, the black matrix BM is extended along the gate line GL and/or the data line DL and may cover the gate line GL and/or the data line DL. Further, the black matrix BM may extend to the portion with the thin film transistor and at least partially cover the thin film transistor. In this case, the black matrix BM and the color filter CF may at least partially overlap each other at the portion with the thin film transistor.

In an embodiment, the array substrate (or transistor structure) is applied to the liquid crystal display device. In an embodiment the array substrate (or transistor structure) may be applied to an organic light emitting display device.

FIGS. 17 to 22 are cross-sectional views for describing a method of manufacturing an array substrate according to an embodiment.

Referring to FIGS. 17 to 22, the method of manufacturing the array substrate according to the embodiment includes forming a structural member PT including an upper surface PT_s projected from the upper surface and a lateral surface PT_h extended from the outside of the upper surface PT_s toward the upper surface of the first substrate 500, forming a gate electrode GE on the structural member PT, forming a semiconductor member 700 on the gate electrode GE, and forming a source electrode SE and a drain electrode DE to be insulated from the gate electrode GE, in which either the source electrode SE or the drain electrode DE is formed on the upper surface PT_s of the structural member PT.

Figure 17:
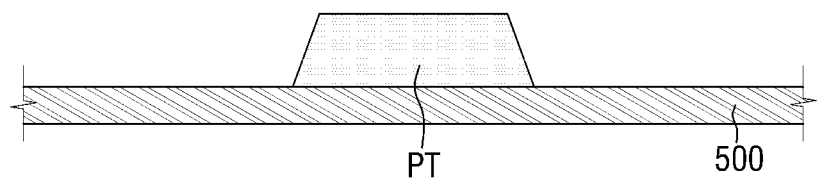
FIG. 17 is a cross-sectional view illustrating a method of manufacturing an array substrate (and/or a transistor structure) according to an embodiment.

First, referring to FIG. 17, the forming of the structural member PT on the first substrate 500 is performed. The structural member PT and the first substrate 500 may be substantially the same as those described in the array substrate according to some embodiments described above.

The structural member PT may be formed by forming and processing at least one layer by a chemical vapor deposition or sputtering method. Further, when the structural member PT is formed by patterning the at least one layer, a photolithography process may be applied.

Figure 18:
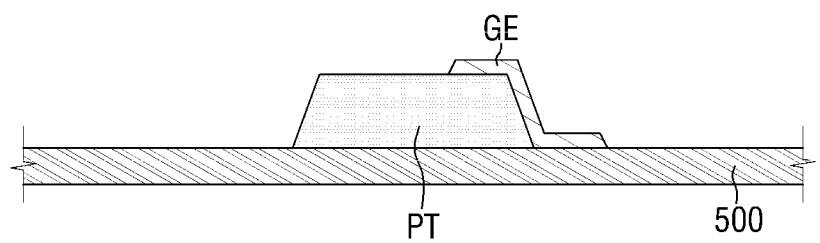
FIG. 18 is a cross-sectional view illustrating a method of manufacturing an array substrate (and/or a transistor structure) according to an embodiment.

Subsequently, referring to FIG. 18, the forming of the gate electrode GE on the structural member PT may be performed. The gate electrode GE may be formed on a lateral surface PT_h of the structural member PT. Illustratively, the gate electrode GE may be formed over the upper surface PT_s and the lateral surface PT_h of the structural member PT, and the upper surface of the first substrate 500.

Further, the gate electrode GE may be made of the same material as the gate line GL. In other words, the gate electrode GE and the gate line GL may be simultaneously obtained by forming and patterning the same metal layer.

The gate electrode GE and the gate line GL may be substantially the same as the gate electrode of the array substrate according to some embodiments described above, and thus the detailed description thereof will be omitted.

Figure 19:
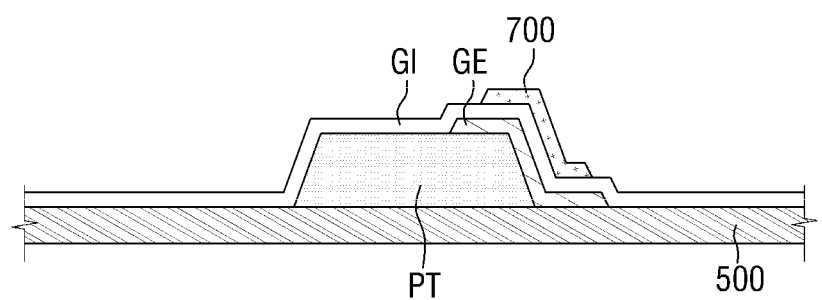
FIG. 19 is a cross-sectional view illustrating a method of manufacturing an array substrate (and/or a transistor structure) according to an embodiment.

Subsequently, referring to FIG. 19, the gate insulation film GI is formed on the first substrate 500, the structural member PT, and the gate electrode GE.

The gate insulation film GI may be formed on the entire first substrate 500 to cover the first substrate 500, the structural member PT, and the gate electrode GE. For example, the gate insulation film GI may be formed on the entire first substrate 500 by a method such as chemical vapor deposition.

The gate insulation film GI may be substantially the same as those described in the array substrate according to some embodiments described above.

Subsequently, the semiconductor member 700 may be formed on the gate insulation film GI.

The semiconductor member 700 may be formed by depositing and patterning a semiconductor layer on the entire first substrate 500. A dry etching or wet etching method may be applied by using a photosensitive member as a mask when patterning the semiconductor layer. However, a method of forming the semiconductor member 700 is not limited thereto. The semiconductor member 700 may be substantially the same as the semiconductor member 700 described in the array substrate according to some embodiments described above.

Figure 20:
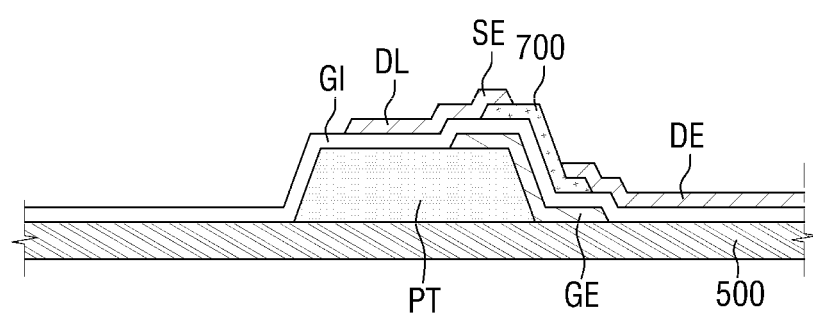
FIG. 20 is a cross-sectional view illustrating a method of manufacturing an array substrate (and/or a transistor structure) according to an embodiment.

Subsequently, referring to FIG. 20, the forming of the data lines DL, DE, and SE to be insulated from the gate electrode GE is performed.

The source electrode SE, the drain electrode DE, and the data line DL may be formed by depositing and patterning at least one metal layer. The deposition of the metal layer may be performed by a method such as chemical vapor deposition or sputtering. The patterning of the metal layer may be performed by an etching process using the photosensitive member as the mask. The mask may be formed using a photolithography process.

The source electrode SE, the drain electrode DE, and the data line DL may be substantially the same as those described in the array substrate according to some embodiments described above.

That is, an array substrate having a bottom gate structure may be manufactured by the method of manufacturing the array substrate according to the embodiment.

Figure 21:
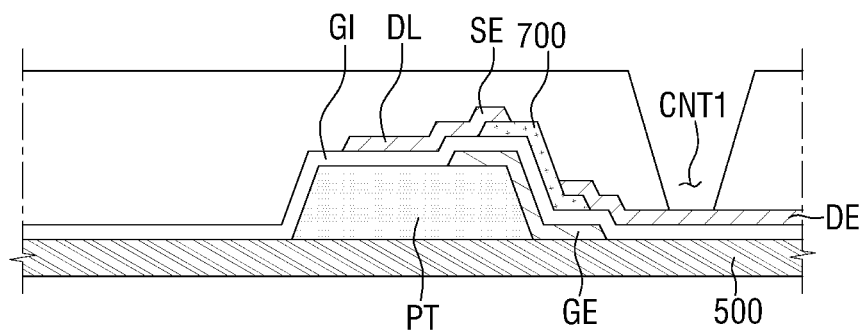
FIG. 21 is a cross-sectional view illustrating a method of manufacturing an array substrate (and/or a transistor structure) according to an embodiment.

Subsequently, referring to FIG. 21, the passivation film 600 is formed on the source electrode SE, the drain electrode DE, the data line DL, the first substrate 500, and the gate insulation film GI. The passivation film 600 as a planarization film covers the source electrode SE, the drain electrode DE, the data line DL, the first substrate 500, and the gate insulation film GI and may be formed on the entire first substrate 500. The passivation film 600 may be made of an organic insulating material or an inorganic insulating material.

Subsequently, the forming of the first contact hole CNT1 on the passivation film 600 may be performed. The first contact hole CNT1 penetrates the passivation film 600 to at least partially expose the surface of the drain electrode DE.

Figure 22:
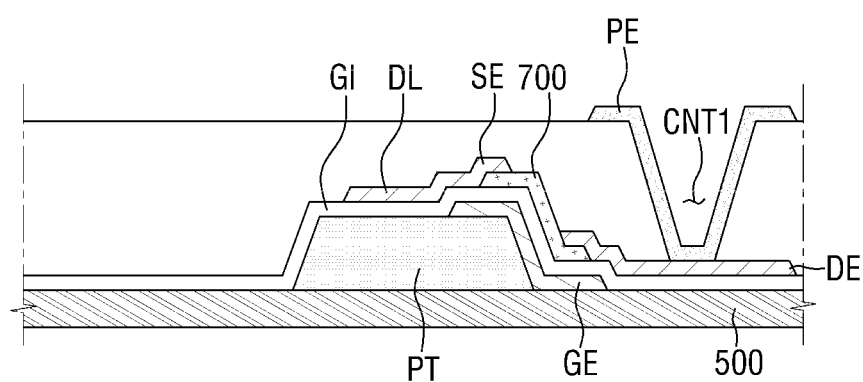
FIG. 22 is a cross-sectional view illustrating a method of manufacturing an array substrate (and/or a transistor structure) according to an embodiment.

Subsequently, referring to FIG. 22, the forming of the pixel electrode PE on the passivation film 600 may be performed. The pixel electrode PE may be formed by a method of depositing and patterning at least one metal layer. The deposition of the metal layer may be performed by a method such as chemical vapor deposition or sputtering. The patterning of the metal layer may be performed by an etching process using the photosensitive member as the mask. The mask may be formed using a photolithography process. The pixel electrode PE may be electrically connected with the drain electrode DE through the first contact hole CNT1 penetrating the passivation film 600. The pixel electrode PE may be made of indium tin oxide (ITO) or indium zinc oxide (IZO) as described above.

FIGS. 23 to 28 are cross-sectional views illustrating a method of manufacturing an array substrate according to an embodiment.

Referring to FIGS. 23 to 28, the method of manufacturing the array substrate according an embodiment is different from the embodiment of FIGS. 17 to 22 in that the array substrate has a top gate structure.

The method of manufacturing the array substrate according to an embodiment includes forming on a first substrate 500 a structural member PT including an upper surface PT_s projected from the upper surface and a lateral surface PT_h extended from the outside of the upper surface PT_s toward the upper surface of the first substrate 500, forming a semiconductor member 700 on the structural member PT, forming a gate electrode GE on the semiconductor member 700, and forming a source electrode SE and a drain electrode DE to be insulated from the gate electrode GE, in which either the source electrode SE or the drain electrode DE is formed on the upper surface of the structural member PT.

Figure 23:
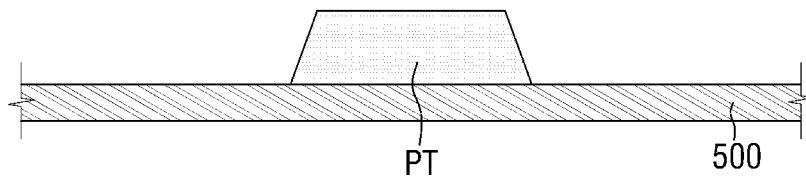
FIG. 23 is a cross-sectional view illustrating a method of manufacturing an array substrate (and/or a transistor structure) according to an embodiment.

First, referring to FIG. 23, the forming of the structural member PT on the first substrate 500 is performed. The structural member PT and the first substrate 500 may be substantially the same as those described in the array substrate according to some embodiments described above.

The structural member PT may be formed by forming and processing at least one layer by a chemical vapor deposition or sputtering method. Further, when the structural member PT is formed by patterning the at least one layer, a photolithography process may be applied.

Figure 24:
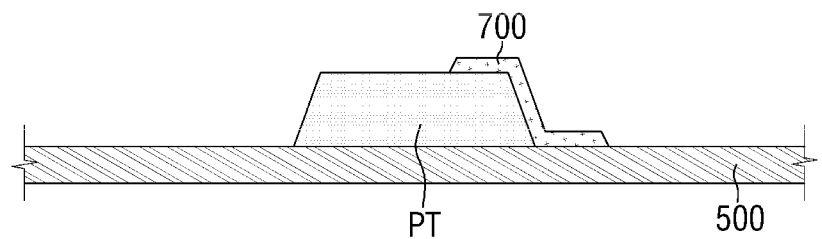
FIG. 24 is a cross-sectional view illustrating a method of manufacturing an array substrate (and/or a transistor structure) according to an embodiment.

Subsequently, referring to FIG. 24, the semiconductor member 700 is formed on the structural member PT. The semiconductor member 700 may be formed by depositing and patterning a semiconductor layer on the entire first substrate 500. A dry etching or wet etching method may be applied by using a photosensitive member as a mask when patterning the semiconductor layer. However, a method of forming the semiconductor member 700 is not limited thereto. The semiconductor member 700 may be substantially the same as the semiconductor member 700 described in the array substrate according to some embodiments described above.

Figure 25:
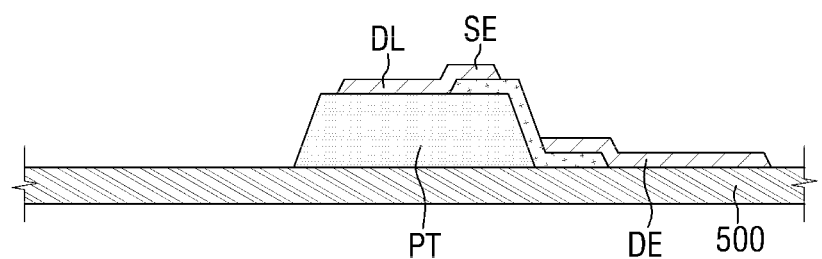
FIG. 25 is a cross-sectional view illustrating a method of manufacturing an array substrate (and/or a transistor structure) according to an embodiment.

Subsequently, referring to FIG. 25, the forming of the data lines DL, DE, and SE on the semiconductor member 700, the first substrate 500, and the structural member PT is performed. The source electrode SE, the drain electrode DE, and the data line DL may be formed by depositing and patterning at least one metal layer. The deposition of the metal layer may be performed by a method such as chemical vapor deposition or sputtering. The patterning of the metal layer may be performed by an etching process using the photosensitive member as the mask. The mask may be formed using a photolithography process.

The source electrode SE, the drain electrode DE, and the data line DL may be substantially the same as those described in the array substrate according to some embodiments described above.

That is, an array substrate having a top gate structure may be manufactured by the method of manufacturing the array substrate according to the embodiment.

Figure 26:
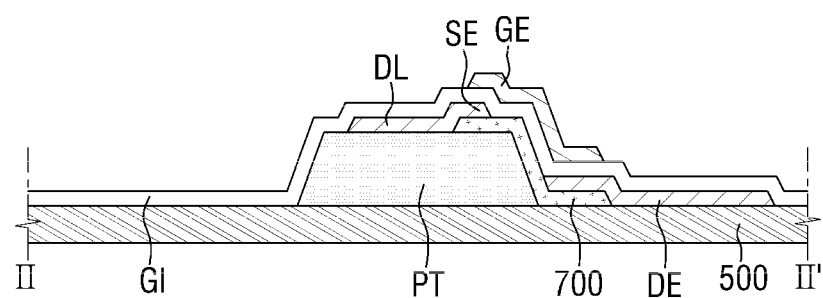
FIG. 26 is a cross-sectional view illustrating a method of manufacturing an array substrate (and/or a transistor structure) according to an embodiment.

Subsequently, referring to FIG. 26, the gate insulation film GI is formed on the source electrode SE, the drain electrode DE, the data line DL, and the first substrate 500. The gate insulation film GI covers the source electrode SE, the drain electrode DE, and the data line DL and may be formed on the entire first substrate 500.

Subsequently, the gate electrode GE is formed on the gate insulation film GI. The gate insulation film GI may be substantially the same as the gate insulation film GI described in the array substrate according to some embodiments described above. That is, the gate electrode GE may be made of the same material as the gate line GL. In other words, the gate electrode GE and the gate line GL may be simultaneously obtained by forming and patterning the same metal layer.

Figure 27:
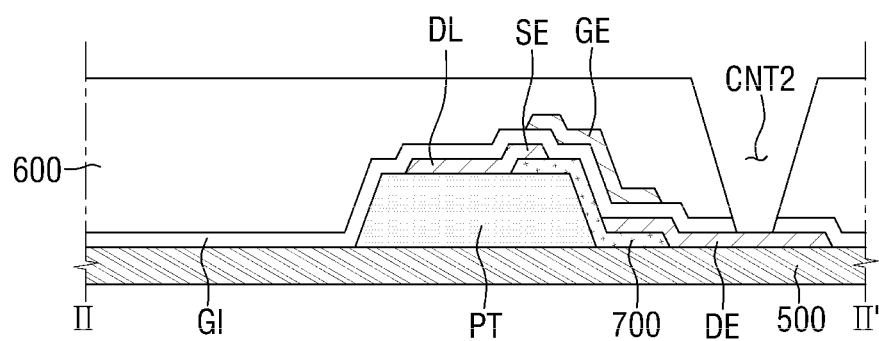
FIG. 27 is a cross-sectional view illustrating a method of manufacturing an array substrate (and/or a transistor structure) according to an embodiment.

Subsequently, referring to FIG. 27, the passivation film 600 is formed on the gate electrode GE, the first substrate 500, and the gate insulation film GI. The passivation film 600 as a planarization film covers the gate electrode GE, the first substrate 500, and the gate insulation film GI and may be formed on the entire first substrate 500. The passivation film 600 may be made of an organic insulating material or an inorganic insulating material.

Subsequently, the forming of the second contact hole CNT2 on the passivation film 600 may be performed. The second contact hole CNT2 penetrates the passivation film 600 and the gate insulation film GI to at least partially expose the surface of the drain electrode DE.

Figure 28:
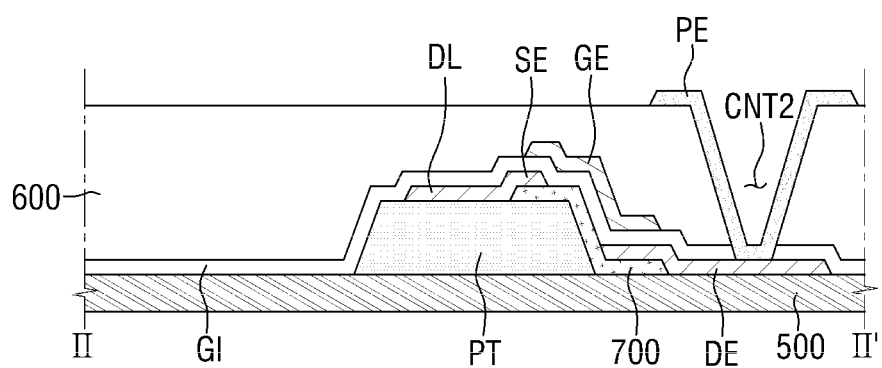
FIG. 28 is a cross-sectional view illustrating a method of manufacturing an array substrate (and/or a transistor structure) according to an embodiment.

Subsequently, referring to FIG. 28, the forming of the pixel electrode PE on the passivation film 600 may be performed. The pixel electrode PE may be formed by a method of depositing and patterning at least one metal layer. The deposition of the metal layer may be performed by a method such as chemical vapor deposition or sputtering. The patterning of the metal layer may be performed by an etching process using the photosensitive member as the mask. The mask may be formed using a photolithography process. The pixel electrode PE may be electrically connected with the drain electrode DE through the second contact hole CNT2 penetrating the passivation film 600 and the gate insulation film GI. The pixel electrode PE may be made of indium tin oxide (ITO) or indium zinc oxide (IZO).

While embodiments have been illustrated and described, it will be understood by those of ordinary skill in the art that various changes in form and detail may be made without departing from the spirit and scope defined by the following claims. The described embodiments should be considered in an illustrative sense and not for purposes of limitation.

What is claimed is:

1. A transistor structure, comprising:
    a substrate;
    a first data line and a second data line both made of a first material and both overlapping a face of the substrate;
    a first electrode made of the first material and directly connected to the first data line;
    a second electrode spaced apart from the first electrode;
    a third electrode made of the first material and directly connected to the second data line;
    a first semiconductor member, which comprises a first semiconductor portion directly contacting the first electrode, a second semiconductor portion directly contacting the second electrode, and a third semiconductor portion which directly connects the first semiconductor portion and the second semiconductor portion; and
    a structural member, which is an insulating material layer and is positioned between the second semiconductor portion and the substrate in a direction perpendicular to the face of the substrate,
    wherein the first semiconductor portion is positioned farther from or closer to the substrate than the second semiconductor portion,
    wherein the first data line is positioned farther from or closer to the substrate than the second data line,
    wherein the first data line does not overlap the second data line in a in the direction perpendicular to the face of the substrate,
    wherein the first data line and the first electrode do not overlap the structural member in the direction perpendicular to the face of the substrate, and
    wherein the second data line and the third electrode overlap the structural member in the direction perpendicular to the face of the substrate.

2. The transistor structure of claim 1, further comprising a gate electrode which overlaps the first semiconductor member.

3. The transistor structure of claim 2, wherein the gate electrode comprises a first conductive portion overlapping the first semiconductor portion, a second conductive portion overlapping the second semiconductor portion, and a third conductive portion which directly connects the first conductive portion and the second conductive portion,
    wherein the first conductive portion is positioned farther from or closer to the substrate than the second conductive portion.

4. The transistor structure of claim 3, wherein the second electrode and the second data line overlap a same face of the structural member in the direction perpendicular to the face of the substrate.

5. The transistor structure of claim 4, wherein one of the first conductive portion and the second conductive portion does not overlap the structural member in the direction perpendicular to the face of the substrate.

6. The transistor structure of claim 4, wherein the first semiconductor portion is positioned closer to the substrate than the second semiconductor portion by a first amount, and
    wherein the first amount is greater than 0 and is less than or equal to a thickness of the structural member.

7. The transistor structure of claim 4, wherein the second electrode is spaced apart from the structural member.

8. The transistor structure of claim 4, wherein the first semiconductor member directly contacts the structural member.

9. The transistor structure of claim 4, wherein the gate electrode directly contacts the structural member.

10. The transistor structure of claim 1, wherein the first semiconductor portion directly contacts a lower surface of the first electrode, and the second semiconductor portion directly contacts an upper portion of the second electrode.

11. The transistor structure of claim 1, wherein the third semiconductor portion extends at a first angle with respect to the first semiconductor portion in a cross-sectional view of the transistor structure, and
    wherein the first angle is greater than 0 degrees and less than 180 degrees.

12. The transistor structure of claim 11, wherein the first angle is 90 degrees.

* * * * *